US009831067B2

(12) United States Patent
Iwasaki et al.

(10) Patent No.: US 9,831,067 B2
(45) Date of Patent: Nov. 28, 2017

(54) FILM-FORMING APPARATUS

(71) Applicant: TOKYO ELECTRON LIMITED, Tokyo (JP)

(72) Inventors: Masahide Iwasaki, Miyagi (JP); Toshihiko Iwao, Miyagi (JP); Koji Yamagishi, Miyagi (JP); Satoshi Yonekura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 127 days.

(21) Appl. No.: 14/434,738

(22) PCT Filed: Sep. 30, 2013

(86) PCT No.: PCT/JP2013/076544
§ 371 (c)(1),
(2) Date: Apr. 9, 2015

(87) PCT Pub. No.: WO2014/057836
PCT Pub. Date: Apr. 17, 2014

(65) Prior Publication Data
US 2015/0279627 A1    Oct. 1, 2015

(30) Foreign Application Priority Data

Oct. 11, 2012  (JP) .................................. 2012-226228

(51) Int. Cl.
*C23C 16/00*     (2006.01)
*C23F 1/00*      (2006.01)
(Continued)

(52) U.S. Cl.
CPC ...... *H01J 37/32238* (2013.01); *C23C 16/345* (2013.01); *C23C 16/4584* (2013.01);
(Continued)

(58) Field of Classification Search
CPC .... H01J 37/32357; H01J 37/32192–37/32311; H01J 37/32733;
(Continued)

(56) References Cited

U.S. PATENT DOCUMENTS

| 5,234,526 A | * | 8/1993 | Chen ................. H01J 37/32238 |
| | | | 118/252 |
| 7,153,542 B2 | | 12/2006 | Nguyen et al. |

(Continued)

FOREIGN PATENT DOCUMENTS

| JP | 2010-56470 A | 3/2010 |
| JP | 2011-222960 A | 11/2011 |

OTHER PUBLICATIONS

International Search Report dated Dec. 17, 2013 in PCT/JP2013/076544.

*Primary Examiner* — Rakesh Dhingra
(74) *Attorney, Agent, or Firm* — Rothwell, Figg, Ernst & Manbeck, P.C.

(57) ABSTRACT

In a film-forming apparatus according to an aspect, a substrate placed on a substrate placing region passes through a first region and a second region in this order by rotation of a placing table. A precursor gas is supplied to the first region. Plasma of a reaction gas is generated in the second region by a plasma generation section. The plasma generation section includes an antenna that supplies microwaves as a plasma source. The antenna includes a dielectric window member and a waveguide. The window member is provided above the second region. The waveguide defines a waveguide path that extends in a radial direction. The waveguide is formed with a plurality of slot holes that allow the microwaves to pass therethrough from the waveguide path toward the window member plate. A bottom surface of the window member defines a groove that extends in the radial direction.

13 Claims, 23 Drawing Sheets

(51) Int. Cl.
*H01L 21/306* (2006.01)
*H01J 37/32* (2006.01)
*C23C 16/511* (2006.01)
*H01L 21/02* (2006.01)
*H05H 1/46* (2006.01)
*C23C 16/34* (2006.01)
*C23C 16/455* (2006.01)
*C23C 16/458* (2006.01)

(52) U.S. Cl.
CPC .. *C23C 16/45536* (2013.01); *C23C 16/45544* (2013.01); *C23C 16/45551* (2013.01); *C23C 16/511* (2013.01); *H01J 37/3222* (2013.01); *H01J 37/32192* (2013.01); *H01J 37/32229* (2013.01); *H01J 37/32357* (2013.01); *H01J 37/32715* (2013.01); *H01J 37/32733* (2013.01); *H01L 21/0217* (2013.01); *H01L 21/0228* (2013.01); *H01L 21/02274* (2013.01); *H05H 1/46* (2013.01); *H01J 2237/332* (2013.01); *H05H 2001/4622* (2013.01)

(58) Field of Classification Search
CPC ........... H01J 37/32715; H01J 2237/332; H01J 37/3222; C23C 16/45544; C23C 16/4584; C23C 16/345; C23C 16/45551; C23C 16/45536; C23C 16/511; H05H 1/46; H05H 2001/4622; H05H 2001/4607; H05H 2001/4615; H05H 2001/463; H01L 21/02274; H01L 21/0217; H01L 21/0228
USPC .............................. 156/345.41; 118/723 MW
See application file for complete search history.

(56) References Cited

U.S. PATENT DOCUMENTS

2005/0145178 A1* 7/2005 Taguchi ............. H01J 37/32211
   118/723 MW
2010/0032094 A1* 2/2010 Tian ...................... C23C 16/511
   156/345.41
2010/0055347 A1* 3/2010 Kato ...................... C23C 16/452
   427/569

* cited by examiner

FILM-FORMING APPARATUS

CROSS REFERENCE TO RELATED APPLICATION

This application is a 35 U.S.C. 371 National Phase Entry Application from PCT/JP2013/076544, filed Sep. 30, 2013, which claims priority to Japanese Patent Application No. 2012-226228, filed Oct. 11, 2012, the disclosures of which are incorporated herein in their entirety by reference.

TECHNICAL FIELD

An exemplary embodiment of the present disclosure relates to a film-forming apparatus.

BACKGROUND ART

As a kind of a technique that forms a film on a substrate, a plasma-enhanced atomic layer deposition (PE-ALD) method is known. In the PE-ALD method, the substrate is exposed to a precursor gas to chemically adsorb the precursor gas containing constituent elements of a thin film. Subsequently, the substrate is exposed to a purge gas to remove the precursor gas excessively chemically adsorbed to the substrate. In addition, the substrate is exposed to plasma of a reaction gas containing constituent elements of a thin film so as to form a desired thin film on the substrate. In the PE-ALD method, the above-described processes are repeated, so that a film processed by atoms or molecules contained in the precursor gas is generated on the substrate.

As an apparatus that performs the PE-ALD method, a single substrate type film-forming apparatus and a semi-batch type film-forming apparatus are known. In the single substrate type film-forming apparatus, the aforementioned process of the PE-ALD method is repeated in a single processing chamber. That is, in the single substrate type film-forming apparatus, the precursor gas is supplied into the single processing chamber, subsequently, the purge gas is supplied into the processing chamber, then, the reaction gas is supplied into the processing chamber, and plasma of the reaction gas is generated. Further, in the single substrate type film-forming apparatus, the purge gas is supplied into the processing chamber after generation of the plasma of the reaction gas and before subsequent supply of precursor gas. In the single substrate type film-forming apparatus, the supply of the precursor gas, the supply of the purge gas, the generation of the plasma of the reaction gas, and the supply of the purge gas need to be performed in sequence temporally as described above. Thus, a throughput becomes comparatively lowered.

Meanwhile, in the semi-batch type film-forming apparatus, a precursor gas-supplied region and a reaction gas plasma generation region are separately formed in the processing chamber and a substrate moves to pass through the regions in this order. In the semi-batch type film-forming apparatus, the supply of the precursor gas and the plasma generation of the reaction gas may be simultaneously performed in different regions. Thus, a throughput is higher than that of the single substrate type film-forming apparatus. Such a semi-batch type film-forming apparatus is described in Patent Documents 1 to 3.

As disclosed in Patent Documents 1 to 3, a semi-batch type film-forming apparatus includes a space in a processing container divided into a first region and a second region in a circumferential direction, in which plasma of a reaction gas is supplied into the second region. Further, the film-forming apparatus includes a placing table having a plurality of placing regions arrayed in the circumferential direction. The film-forming apparatus is configured to rotate the placing table around an axis in a processing container such that a substrate passes through the first region and the second region in sequence.

PRIOR ART DOCUMENT

Patent Document

Patent Document 1: U.S. Pat. No. 7,153,542
Patent Document 2: Japanese Patent Laid-Open Publication No. 2010-56470
Patent Document 3: Japanese Patent Laid-Open Publication No. 2011-222960

SUMMARY OF INVENTION

Technical Problem

In the aforementioned semi-batch type film-forming apparatus, a circumferential speed in each portion of the substrate depends on a distance from the axis. That is, even in the same substrate, a circumferential speed at a position distant from the axis is higher than that at a position close to the axis. Therefore, the exposure time to plasma may vary depending on the position on the substrate.

The present inventors have studied a film-forming apparatus which can introduce microwaves into a second region from a dielectric window having two edges of which the distance from each other in a circumferential direction increases as a distance from the axis increases, that is, a substantially fan-shaped flat dielectric window in order to equalize a plasma processing time for the substrate regardless of the position on the substrate. The present inventors have found that, when pressure in the second region of the film-forming apparatus is increased, plasma may not be uniformly generated just below the dielectric window, and the plasma generation region may be changed.

Accordingly, what is requested in the technical field is a film-forming apparatus which is capable of reducing unevenness of the time for plasma processing on the substrate depending on the position on the substrate, and suppressing variation of the plasma generation region even under high pressure.

Technical Solution

A film-forming apparatus according to an aspect includes a placing table, a processing container, a first gas supply section, and a plasma generation section. The placing table includes a substrate placing region and provided to be rotatable around an axis such that the substrate placing region moves in a circumferential direction. The processing container defines a processing chamber. The placing table is accommodated in the processing chamber. The processing chamber includes a first region and a second region. The substrate placing region passes through the first region and the second region in this order while moving in the circumferential direction with respect to the axis by rotation of the placing table. The first gas supply section supplies a precursor gas to the first region. The plasma generation section generates plasma of a reaction gas in the second region. The plasma generation section includes a second gas supply section and an antenna. The second gas supply section supplies the reaction gas to the second region. The antenna introduces microwaves into the second region. The antenna includes a dielectric window member and a waveguide. The window member includes a top surface and a bottom surface and is provided above the second region. The waveguide defines a waveguide path that extends in a radial direction with respect to the axis. The waveguide is formed with a plurality of slot holes that allows the microwaves to pass therethrough from the waveguide path toward the window member plate. The bottom surface of the window member defines a groove that extends in the radial direction with respect to the axis. That is, the groove is a slot-shaped groove, which is a radially elongated groove. In an exemplary embodiment, the groove may extend below the waveguide path.

In the film-forming apparatus, a distance between the bottom surface defining the groove and the top surface of the window member is smaller than a distance between the bottom surface around the groove and the top surface of the window member. That is, a thickness of the window member in a portion defining the groove is thinner than a thickness of the window member around the groove. Since microwaves are likely to pass through a thin portion of the window member, an electric field of the microwaves may be concentrated in the groove by the window member. Accordingly, plasma generation region may be fixed within the groove. Therefore, according to the film-forming apparatus, variation of the plasma generation region may be suppressed even under high pressure. Further, the groove extends at length in the radial direction with respect to the axis. Therefore, according to the film-forming apparatus, unevenness of the plasma processing time depending on the position on the substrate may be reduced.

In an exemplary embodiment, the window member may include a pair of inner surfaces defining the groove from the circumferential direction, and a distance between the pair of inner surfaces may increase as being spaced away from the axis. In the exemplary embodiment, a width of the groove increases as being spaced away from the axis. Therefore, difference in plasma processing time at different positions having different circumferential speeds on the substrate may be further reduced.

In an exemplary embodiment, the waveguide includes a first wall in contact with the top surface of the window member and a second wall provided to be in parallel with the first wall, the plurality of slot holes is formed in the first wall and arrayed in an extension direction of the waveguide path, the second wall includes a plurality of openings formed therein, and the plurality of openings is arrayed in the extension direction of the waveguide path. The film-forming apparatus in the exemplary embodiment further includes a plurality of plungers attached to the second wall. Each of the plurality of plungers includes a reflective surface capable of changing a position in a direction parallel to the axis in and above a corresponding opening among the plurality of openings. In the exemplary embodiment, a peak position of the microwaves may be adjusted in the waveguide by adjusting the position of the reflective surface of the plunger. Accordingly, a power of the microwaves leaking out from the plurality of slots may be adjusted. Therefore, a difference in the throughput by the plasma at different positions on the substrate may be adjusted and reduced.

In an exemplary embodiment, a coolant path is formed at a side of the waveguide path to extend along the waveguide path, and the groove is formed below the coolant path. Since the plasma is generated in the groove, heat is generated in the window member in the vicinity of the groove. In the exemplary embodiment, since the coolant path is formed above the groove, the heat of the window member may be radiated efficiently.

In an exemplary embodiment, the window member includes a peripheral portion and a window region surrounded by the peripheral portion, and the whole of the window region constitutes a bottom surface of the groove.

In an exemplary embodiment, the plurality of slot holes is formed below a region where a node of standing waves of the microwaves is generated in the waveguide. According to the exemplary embodiment, unevenness of the electric field strength may be reduced inside the groove, as compared with an antenna in which slot holes are formed below a position where an antinode of standing waves of the microwaves, that is, a peak of standing waves is generated.

In an exemplary embodiment, the film-forming apparatus may further include a dielectric slow wave plate provided inside the waveguide. In the exemplary embodiment, the waveguide path in the waveguide is constituted by the dielectric slow wave plate. The slow wave plate may shorten the wavelength of the microwaves and reduce the distance between the peaks of the microwaves in the waveguide. Accordingly, the plasma density distribution may be more precisely controlled in the groove defined by the window member.

In an exemplary embodiment, the waveguide defines the waveguide path such that the waveguide path extends above the substantially whole surface of the window region, the film-forming apparatus further includes a dielectric slow wave plate provided inside the waveguide, the slow wave plate constituting the waveguide path above the window region, and the plurality of slot holes is formed to be distributed below the whole surface of the slow wave plate. That is, the window region may be constituted by the substantially whole region except for the peripheral region of the window member, and the slow wave plate may be provided to face the substantially whole surface of the window region through the waveguide. According to the exemplary embodiment, the efficiency of the heat radiation from the window member via the slow wave plate is further improved.

Advantageous Effects of Invention

As described above, according to one aspect and various exemplary embodiments of the present invention, a film-forming apparatus which is capable of reducing unevenness of the plasma processing time for the substrate depending on the position on the substrate and stably controlling the plasma generating position even high pressure, is provided.

DETAILED DESCRIPTION TO EXECUTE THE INVENTION

Figure 1:
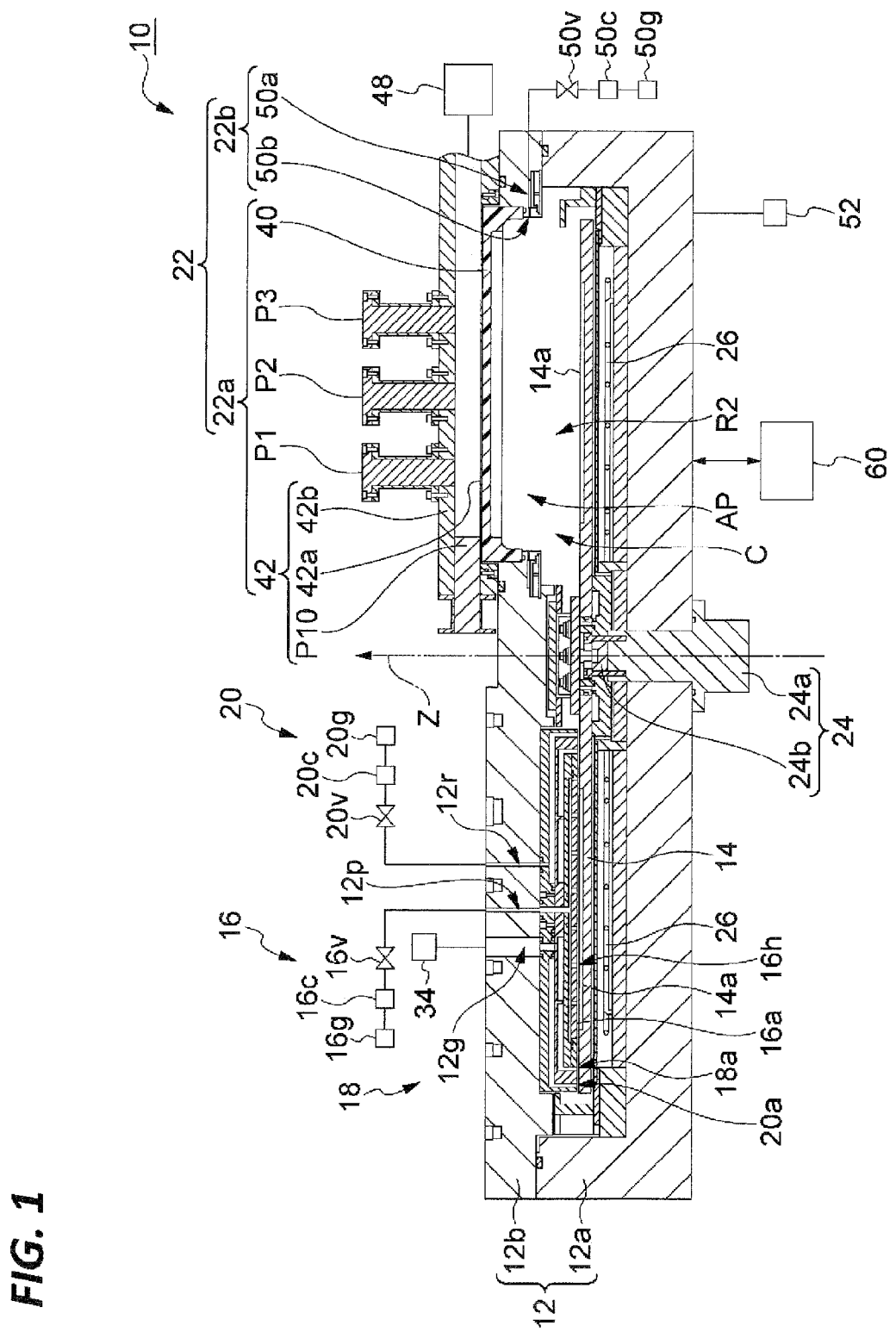
FIG. 1 is a cross-sectional view schematically illustrating a film-forming apparatus according to an exemplary embodiment.

Hereinafter, various exemplary embodiments of the present invention will be described in detail with reference to the accompanying drawings. Further, in the drawings, like or similar portions will be designated by like reference numerals.

Figure 2:
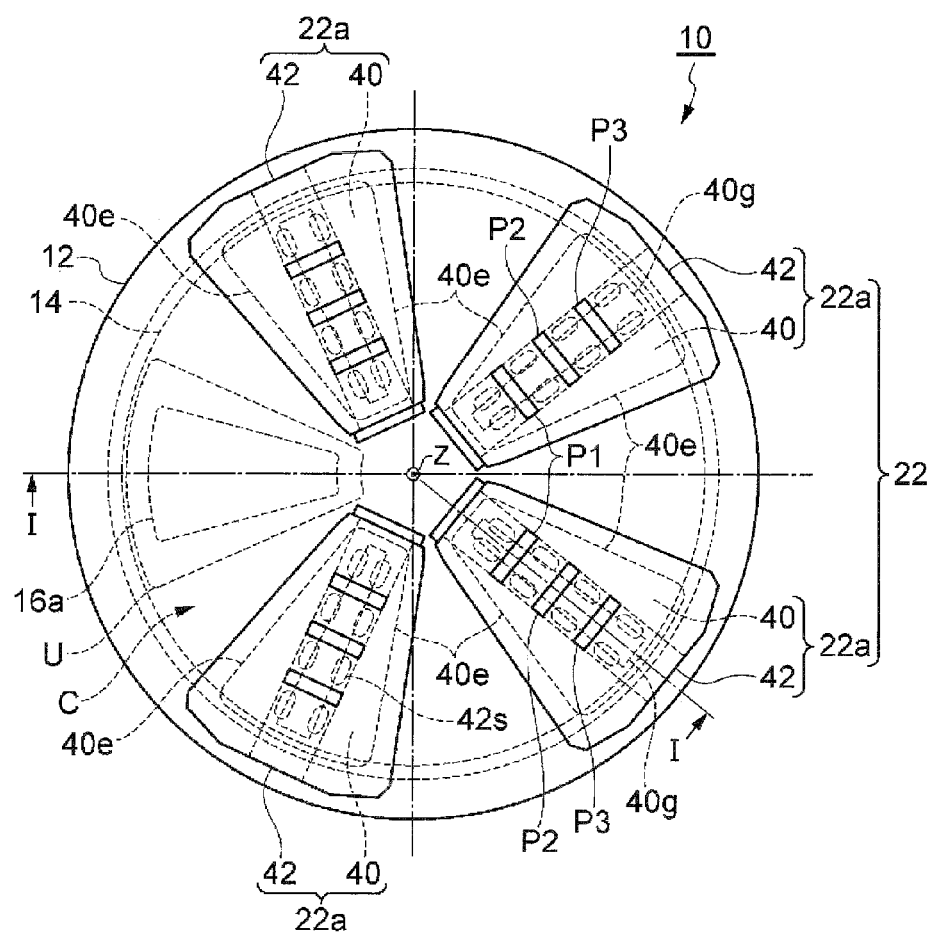
FIG. 2 is a plan view schematically illustrating a film-forming apparatus according to an exemplary embodiment.
Figure 3:
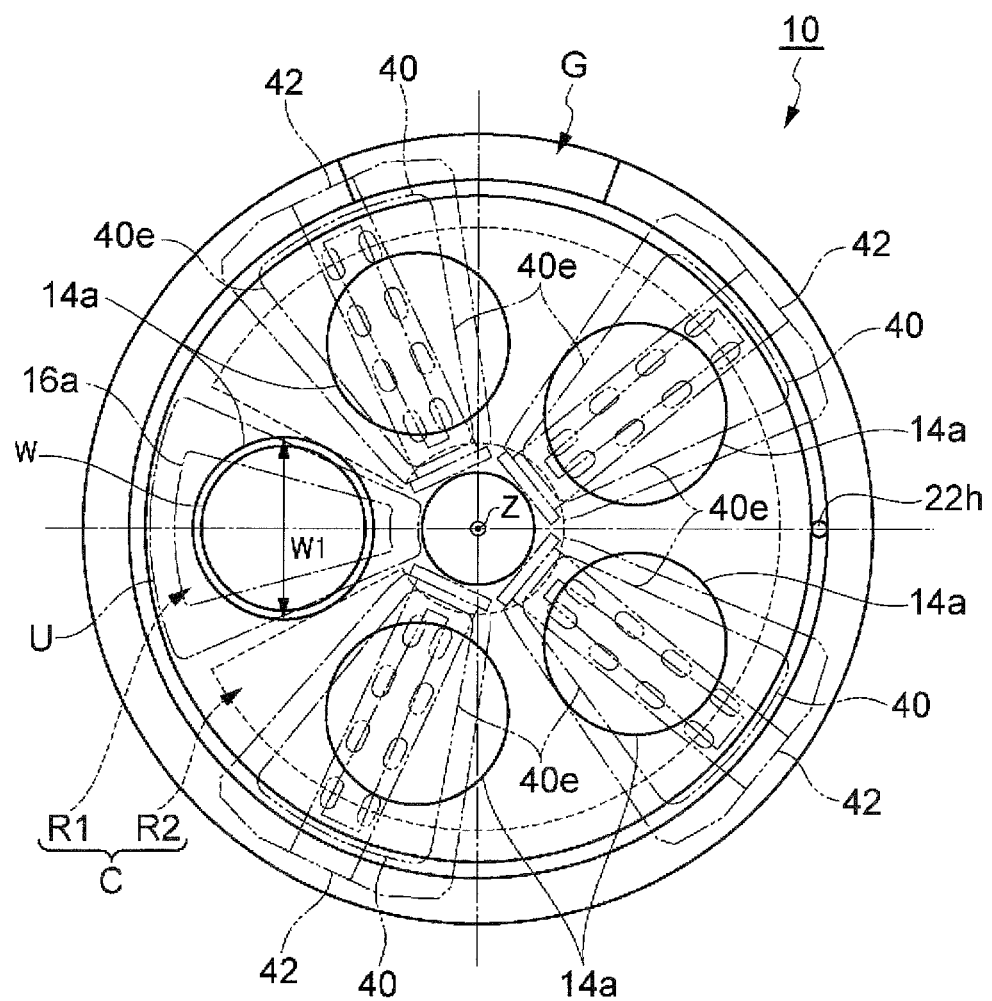
FIG. 3 is a plan view illustrating the film-forming apparatus illustrated in FIG. 2 in a state where the top of a processing container is removed from the film-forming apparatus.

FIG. 1 is a cross-sectional view illustrating a film-forming apparatus according to an exemplary embodiment. FIG. 2 is a top plan view schematically illustrating a film-forming apparatus according to an exemplary embodiment. FIG. 1 illustrates a cross-section taken along line I-I of FIG. 2. FIG. 3 is a plan view illustrating the film-forming apparatus illustrated in FIG. 2 in a state where the top of a processing container is removed from the film-forming apparatus. A film-forming apparatus 10 illustrated in FIGS. 1, 2, and 3 includes a processing container 12, a placing table 14, a gas supply section (first gas supply section) 16, and a plasma generation section 22.

The processing container 12 is a substantially cylindrical container extending in an axis Z direction. The processing container 12 defines a processing chamber C therein. The processing container 12 may be made of, for example, a metal such as, for example, aluminum, in which an anti-plasma processing (e.g., an alumite processing or spraying of $Y_2O_3$) is performed on the inner surface thereof. In an exemplary embodiment, as illustrated in FIG. 1, the processing container 12 includes a lower portion 12a and an upper portion 12b. The lower portion 12a has a top-opened cylindrical shape, and includes a side wall and a bottom wall which define the processing chamber C. The upper portion 12b is a cover which defines the processing chamber C from the top. The upper portion 12b is attached to the top of the lower portion 12a so as to close an upper opening of the lower portion 12a. An elastic sealing member may be provided between the lower portion 12a and the upper portion 12b to seal the processing chamber C.

The placing table 14 is provided in the processing chamber C defined by the processing container 12. The placing table 14 has substantially a disc shape. The placing table 14 is configured to be rotatable around an axis Z. In the exemplary embodiment, the placing table 14 is rotatably driven around the axis Z by a driving mechanism 24. The driving mechanism 24 has a driving device 24a such as, for example, a motor, and a rotation shaft 24b, and is attached to the lower portion 12a of the processing container 12. The rotation shaft 24b extends to the inside of the processing chamber C along the axis Z, and rotates around the axis Z by the driving force from the driving device 24a. The central portion of the placing table 14 is supported on the rotation shaft 24b. As a result, the placing table 14 rotates around the axis Z. Further, an elastic sealing member such as, for example, an O ring, may be provided between the lower portion 12a of the processing container 12 and the driving mechanism 24 so as to seal the processing chamber C.

As illustrated in FIGS. 1 and 3, one or more substrate placing regions 14a are formed on the top surface of the placing table 14. In the exemplary embodiment, the plurality of substrate placing regions 14a is arrayed in a circumferential direction with respect to the axis Z. Each substrate placing region 14a is configured as a recess which has substantially the same diameter as that of a substrate W placed in the region or a slightly larger diameter than that of the substrate W. Heaters 26 are provided below the placing table 14 in the processing chamber C to heat the substrates W placed in the substrate placing regions 14a. The substrates W are transported to the processing chamber C by a transporting apparatus such as, for example, a robot arm, through a gate valve G provided in the processing container 12, and placed in the substrate placing region 14a. Further, the substrates W processed by the film-forming apparatus 10 are taken out from the processing chamber C through the gate valve G by the transporting apparatus. The processing chamber C includes a first region R1 and a second region R2 which are arrayed in the circumferential direction with respect to the axis Z. Accordingly, the substrates W placed in the substrate placing regions 14a sequentially pass through the first region R1 and the second region R2 according to the rotation of the placing table 14.

Figure 4:
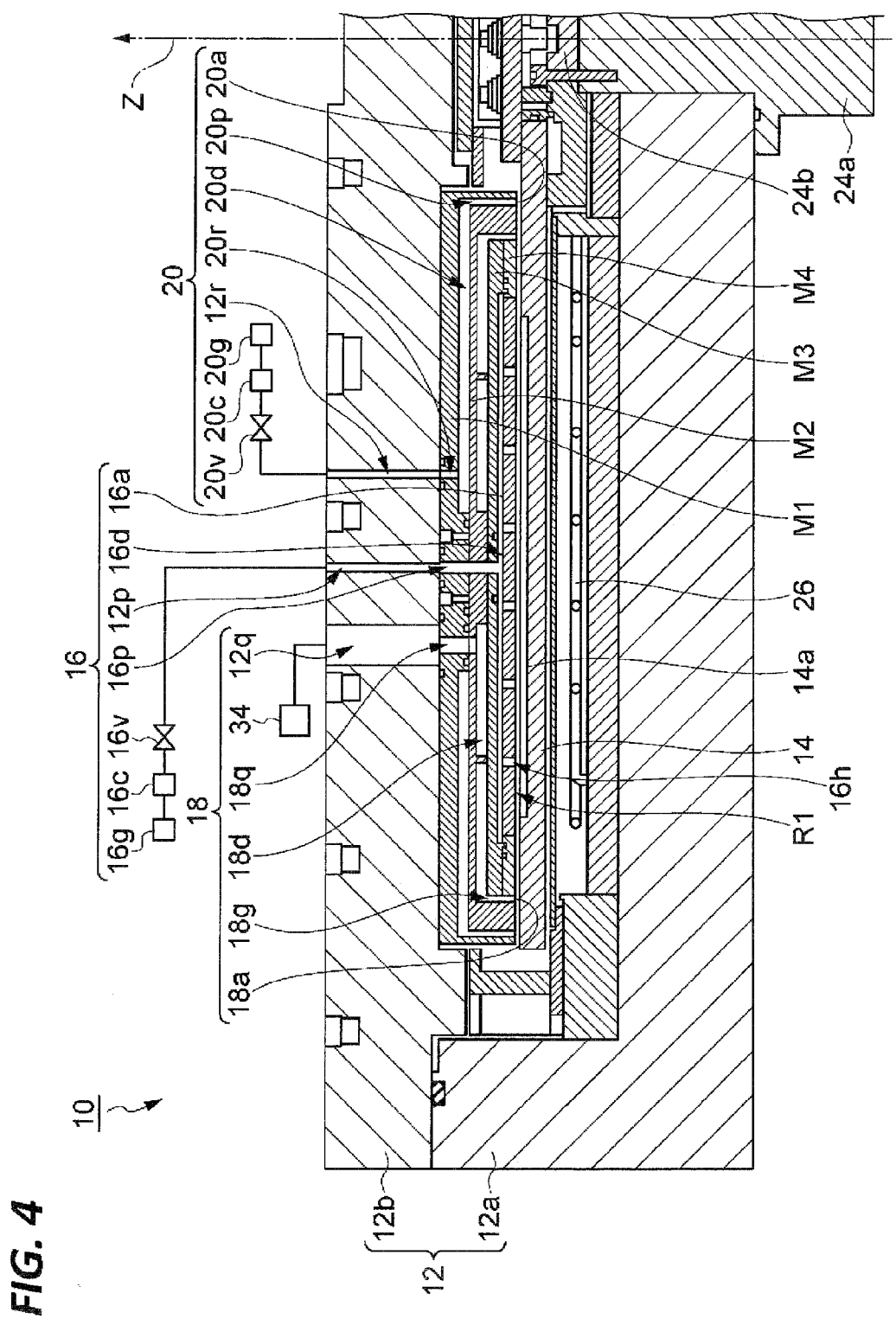
FIG. 4 is a view illustrating one side of a cross-section of the film-forming apparatus illustrated in FIG. 1 with respect to an axis Z, that is, a first region side, in an enlarged scale.
Figure 5:
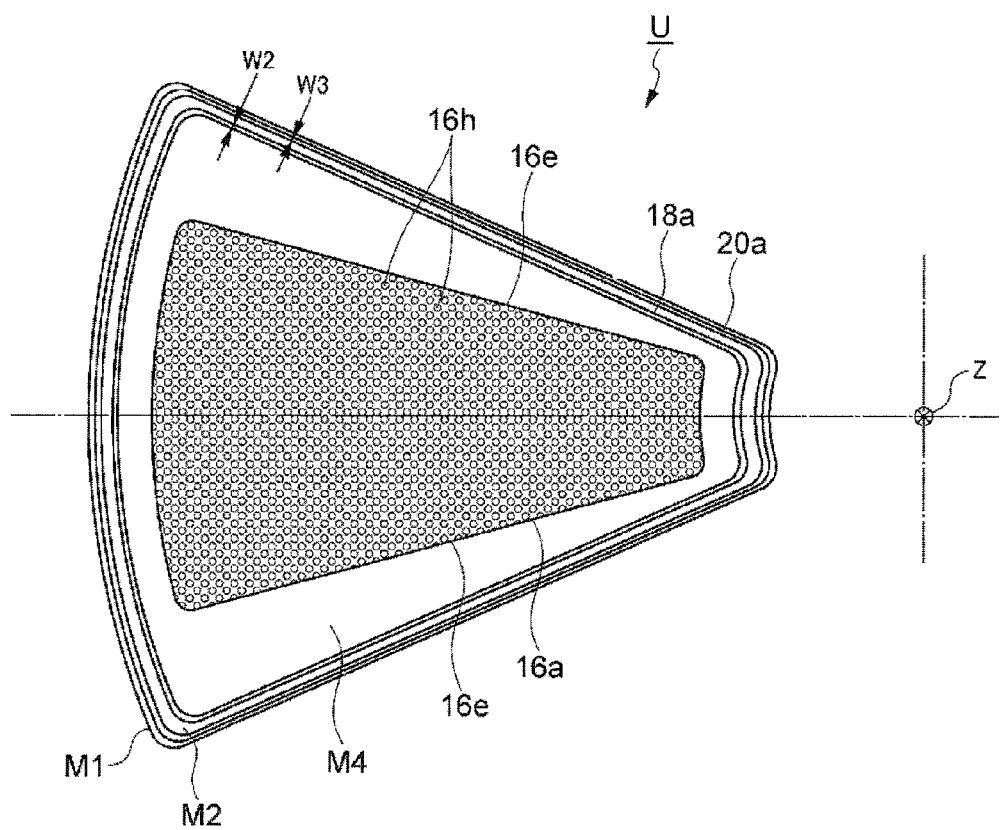
FIG. 5 is a plan view illustrating an injection section 16a of a gas supply section 16, an exhaust port 18a of an exhaust section 18, and an injection port 20a of a gas supply section 20 of the film-forming apparatus illustrated in FIG. 1.

Hereinafter, reference will also be made to FIGS. 4 and 5 in addition to FIGS. 2 and 3. FIG. 4 is a view illustrating one side of a cross-section of the film-forming apparatus illustrated in FIG. 1 with respect to an axis Z, that is, a first region side, in an enlarged scale. FIG. 5 is a plan view illustrating an injection section 16a of the gas supply section 16, an exhaust port 18a of an exhaust section 18, and an injection port 20a of a gas supply section 20 of the film-forming apparatus illustrated in FIG. 1. As illustrated in FIGS. 2 to 4, the injection section 16a of the gas supply section 16 is provided above the first region R1 so as to face the top surface of the placing table 14. In other words, a region facing the injection section 16a among the regions included in the processing chamber C becomes the first region R1.

As illustrated in FIGS. 4 and 5, a plurality of injection ports 16h is formed in the injection section 16a. The gas supply section 16 supplies a precursor gas to the first region R1 from the plurality of injection ports 16h. The precursor gas is supplied to the first region R1, and thus, the precursor gas is chemically adsorbed on the surface of the substrates W passing through the first region R1. As for the precursor gas, for example, dichlorosilane (DCS) may be exemplified.

In an exemplary embodiment, as illustrated in FIG. 5, two edges 16e defining the injection section 16a from the circumferential direction are included in the edges defining the injection section 16a. The two edges 16e extend to come closer to each other as they approach, the axis Z. The two edges 16e may extend, for example, in a radial direction with respect to the axis Z. That is, the injection section 16a may have a substantially fan-shaped planar shape. The plurality of injection ports 16h is formed between the two edges 16e. Here, a circumferential speed at each position on the substrate W according to the rotation of the placing table 14 varies depending on a distance from the axis Z. That is, a circumferential speed at a position which is spaced farther away from the axis Z becomes higher. In an exemplary embodiment, the injection section 16a is configured to face more injection ports 16h at a position which is farther away from the axis Z in the substrate W. Accordingly, the unevenness of the length of time in which each position of the substrate W is exposed to the precursor gas may be reduced.

As illustrated in FIGS. 4 and 5, the exhaust port 18a is formed around the injection section 16a, and the exhaust section 18 performs exhaust of the first region R1 from the exhaust port 18a. The exhaust port 18a of the exhaust section 18 faces the top surface of the placing table 14, and as illustrated in FIG. 5, extends along a closed path which surrounds the outer periphery of the injection section 16a. As such, in the film-forming apparatus 10, the narrow exhaust port 18a surrounds the periphery of the injection section 16a.

Further, as illustrated in FIGS. 4 and 5, an injection port 20a of the gas supply section 20 is formed around the exhaust port 18a, and the gas supply section 20 injects the purge gas from the injection port 20a. The injection port 20a of the gas supply section 20 faces the top surface of the placing table 14, and extends along the closed path which surrounds the outer circumference of the exhaust port 18a. As for the purge gas supplied by the gas supply section 20, an inert gas such as, for example, $N_2$ gas or Ar gas may be used. When the purge gas is injected to the substrate W, the precursor gas which is excessively chemically adsorbed on the substrate W is removed from the substrate W.

In the film-forming apparatus 10, by the exhaust from the exhaust port 18a and the injection of the purge gas from the injection port 20a, the precursor gas supplied to the first region R1 is suppressed from leaking out to the outside of the first region R1, and further, in the second region R2, a reaction gas or radicals thereof supplied as described below are suppressed from penetrating into the first region R1. That is, the exhaust section 18 and the gas supply section 20 separate the first region R1 and the second region R2. Further, since the injection port 20a and the exhaust port 18a have a band-shaped planar shape extending along the closed path which surrounds the outer periphery of the injection section 16a, the width of each of the injection port 20a and the exhaust port 18a is narrowed. Accordingly, the separation of the first region R1 and the second region R2 is implemented while securing the angular range of the second regions R2 extending in the circumferential direction with respect to the axis Z. In an exemplary embodiment, a width W2 of the exhaust port 18a extending between the first region R1 and the second region R2 and a width W3 of the injection port 20a (see FIG. 5) are smaller than a diameter W1 of the substrate placing regions 14a (see FIG. 3).

Figure 6:
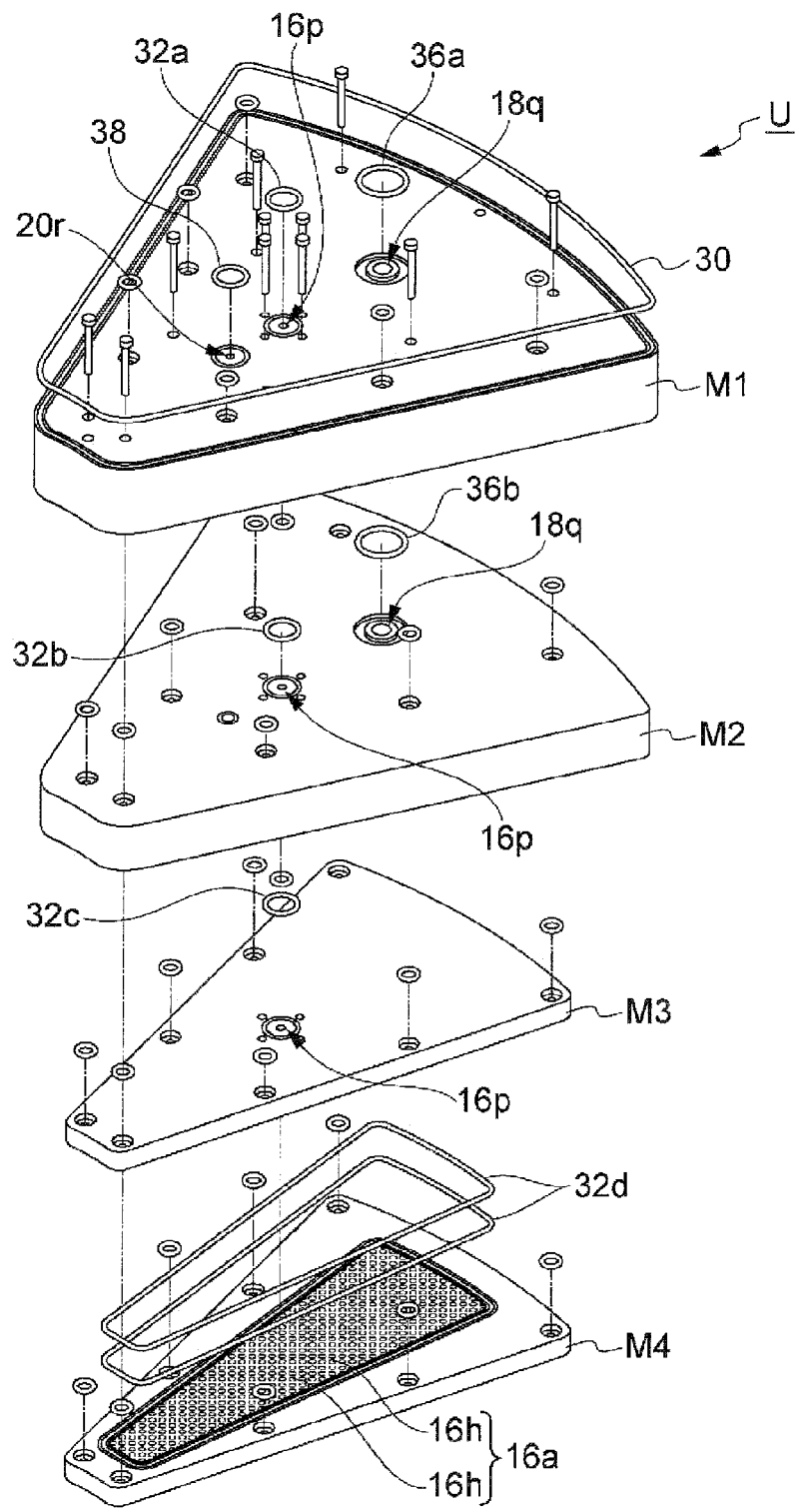
FIG. 6 is an exploded perspective view illustrating a unit related to an exemplary embodiment, which defines the injection section 16a of the gas supply section 16, the exhaust port 18a of the exhaust section 18, and the injection port 20a of the gas supply section 20.
Figure 7:
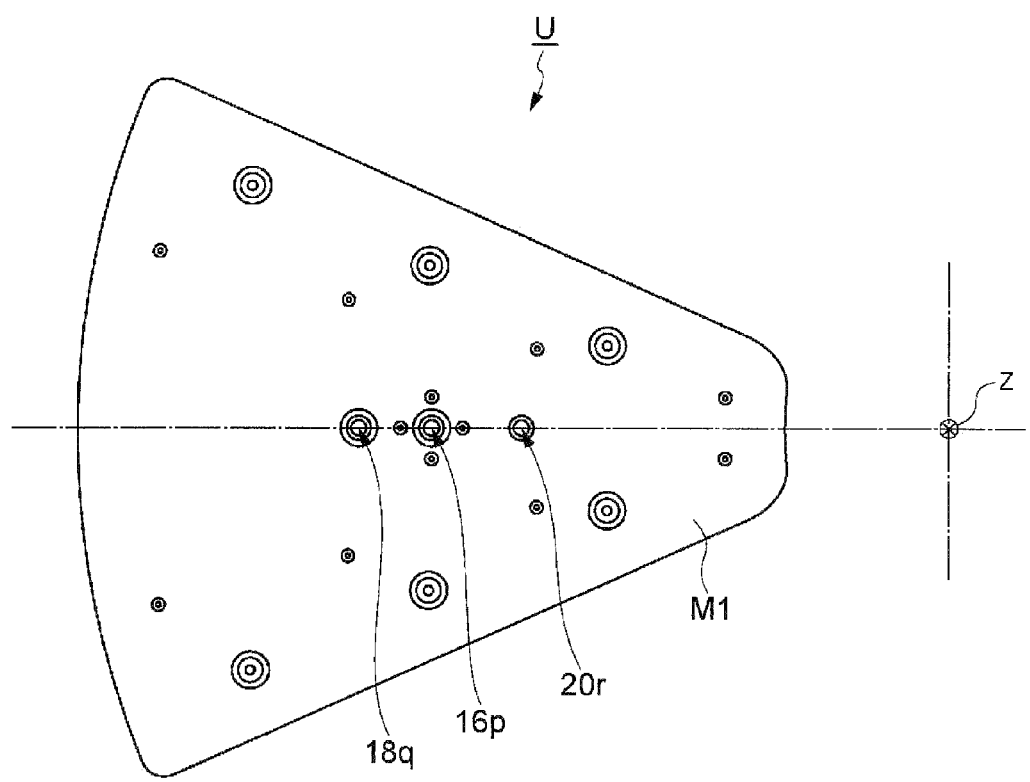
FIG. 7 is a plan view illustrating the unit illustrated in FIG. 6, which is viewed from the top.

In an exemplary embodiment, the film-forming apparatus 10 may include a unit U which defines the injection section 16a, the exhaust port 18a, and the injection port 20a. Hereinafter, the exemplary embodiment will be described with reference to FIGS. 6 and 7. FIG. 6 is an exploded perspective view of the unit according to an exemplary embodiment, which defines the injection section 16a of the gas supply section 16, the exhaust port 18a of the exhaust section 18, and the injection port 20a of the gas supply section 20. FIG. 7 is a plan view of the unit illustrated in FIG. 6, which is viewed from the top. Further, FIG. 7 illustrates the top surface of the unit U, and FIG. 5 illustrates the bottom surface of the unit U. As illustrated in FIGS. 4 to 7, the unit U is configured by a first member M1, a second member M2, a third member M3, and a fourth member M4, and the first to fourth members M1 to M4 are piled up in this order from the top. The unit U is attached to the processing container 12 to be in contact with the bottom surface of the upper portion 12b of the processing container 12. An elastic sealing member 30 is provided between the bottom surface of the upper portion 12b of the processing container 12 and the first member M1. The elastic sealing member 30 extends along an outer edge of the top surface of the first member M1.

The first to fourth members M1 to M4 have a substantially fan-shaped planar shape. The first member M1 defines a recess on the bottom side thereof, in which the second to forth members M2 to M4 are received. Further, the second member M2 defines a recess on the bottom side thereof, in which the third and fourth members M3 to M4 are received. The third member M3 and the fourth member M4 have substantially the same planar size.

In the unit U, a gas supply path 16p is formed through the first to third members M1 to M3. The gas supply path 16p is connected, at an upper end thereof, with a gas supply path 12p formed in the upper portion 12b of the processing container 12. A gas source 16g of the precursor gas is connected to the gas supply path 12p via a valve 16v and a flow rate controller 16c such as, for example, a mass flow controller. Further, a lower end of the gas supply path 16p is connected to a space 16d formed between the third member M3 and the fourth member M4. An injection port 16h of the injection section 16a formed in the fourth member M4 is connected to the space 16d.

An elastic sealing member 32a such as, for example, an O-ring, is provided between the upper portion 12b of the processing container 12 and the first member M1 to surround a connection portion of the gas supply path 12p and the gas supply path 16p. The elastic sealing member 32a may prevent the precursor gas supplied to the gas supply path 16p and the gas supply path 12p from leaking out from the boundary between the upper portion 12b of the processing container 12 and the first member M1. Further, elastic sealing members 32b and 32c such as, for example, O-rings, are provided between the first member M1 and the second member M2 and between the second member M2 and the third member M3, respectively, to surround the gas supply path 16p. The elastic sealing members 32b and 32c may prevent the precursor gas supplied to the gas supply path 16p from leaking out from the boundary between the first member M1 and the second member M2 and the boundary between the second member M2 and the third member M3. Further, an elastic sealing member 32d is provided between the third member M3 and the fourth member M4 to surround a space 16d. The elastic sealing member 32d may prevent the precursor gas supplied to the space 16d from leaking out from the boundary between the third member M3 and the fourth member M4.

Further, in the unit U, an exhaust path 18q is formed through the first and second members M1 and M2. The exhaust path 18q is connected, at the upper end thereof, with an exhaust path 12q formed in the upper portion 12b of the processing container 12. The exhaust path 12q is connected to an exhaust device 34 such as, for example, a vacuum pump. Further, the exhaust path 18q is connected, at the lower end thereof, to a space 18d formed between the bottom surface of the second member M2 and the top surface of the third member M3. Further, as described above, the second member M2 defines a recess which receives the third member M3 and the fourth member M4, and a gap 18g is formed between the inner surface of the second member M2 defining the recess and the side end surfaces of the third member M3 and the fourth member M4. The space 18d is connected to the gap 18g. The lower end of the gap 18g functions as the above-described exhaust port 18a.

An elastic sealing member 36a such as, for example, an O-ring, is provided between the upper portion 12b of the processing container 12 and the first member M1 to surround a connection portion of the exhaust path 18q and the exhaust path 12q. The elastic sealing member 36a may prevent exhaust gas passing through the exhaust path 18q and the exhaust path 12q from leaking out from the boundary between the upper portion 12b of the processing container 12 and the first member M1. Further, an elastic sealing member 36b such as, for example, an O-ring, is provided between the first member M1 and the second member M2 to surround the exhaust path 18q. The elastic sealing member 32b may prevent the gas passing through the exhaust path 18q from leaking out from the boundary between the first member M1 and the second member M2.

Further, in the unit U, a gas supply path 20r is formed through the first member M1. The gas supply path 20r is connected, at an upper end thereof, with a gas supply path 12r formed in the upper portion 12b of the processing container 12. A gas source 20g of the purge gas is connected to the gas supply path 12r via a valve 20v and a flow rate controller 20c such as, for example, a mass flow controller. Further, a lower end of the gas supply path 20r is connected to a space 20d formed between the bottom surface of the first member M1 and the top surface of the second member M2. Further, as described above, the first member M1 defines the recess which receives the second to fourth members M2 to M4, and a gap 20p is formed between the inner surface of the first member M1 defining the recess and a side surface of the second member M2. The gap 20p is connected to the space 20d. Further, the lower end of the gap 20p functions as the injection port 20a of the gas supply section 20. An elastic sealing member 38 such as, for example, an O-ring is provided between the upper portion 12b of the processing container 12 and the first member M1 to surround a connection portion of the gas supply path 12r and the gas supply path 20r. The elastic sealing member 38 prevents the purge gas passing through the gas supply path 20r and the gas supply path 12r from leaking out from the boundary between the upper portion 12b and the first member M1.

Figure 8:
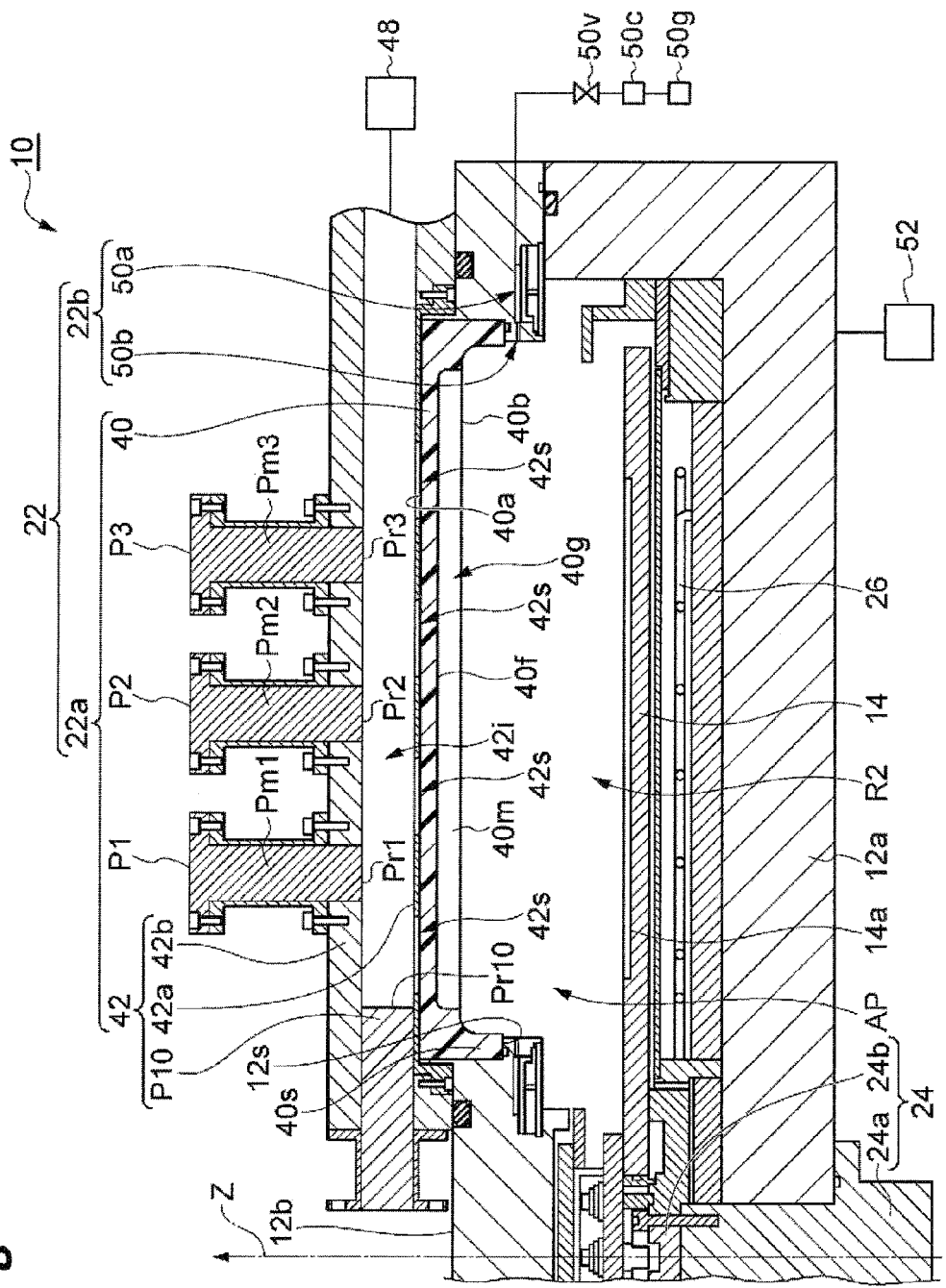
FIG. 8 is a view illustrating another side of the cross-section of the film-forming apparatus illustrated in FIG. 1 with respect to an axis Z, that is, a second region side, in an enlarged scale.

Hereinafter, reference will be made to FIGS. 1 to 3 again, and reference will also be made to FIG. 8. FIG. 8 is a view illustrating another side of the cross-section of the film-forming apparatus illustrated in FIG. 1 with respect to the axis Z, that is, the second region side, in an enlarged scale. Meanwhile, FIG. 1 illustrates a cross-section taken along line I-I of FIG. 2, and FIG. 8 is an enlarged cross-sectional view of the second region side of FIG. 1. However, FIGS. 1 and 8 illustrate different cross-sections only with respect to the slot plate 42a, in which a plurality of slot holes 42s is illustrated. As illustrated in FIGS. 1 to 3 and 8, the film-forming apparatus 10 includes a plasma generation section 22. The plasma generation section 22 generates plasma of a reaction gas in the second region R2 by supplying the reaction gas to the second region R2 and introducing microwaves into the second region R2. In an exemplary embodiment, the precursor gas chemically adsorbed on the substrate W may be nitrified in the second region R2.

The plasma generation section 22 includes a gas supply section (second gas supply section) 22b. The gas supply section 22b supplies a reaction gas to the second region R2. The reaction gas may be, for example, $N_2$ gas or $NH_3$ gas, in a case where a Si-containing precursor gas chemically adsorbed on the substrate W is nitrified as described above.

In an exemplary embodiment, the gas supply section 22b may include a gas supply path 50a and an injection port 50b. The gas supply path 50a is formed in, for example, the upper portion 12b of the processing container 12 to extend around an opening AP. The opening AP is formed in the upper portion 12b of the processing container 12 to expose the bottom surface 40b of a window member 40 to the second region R2 as described below. Further, an injection port 50b is formed in the upper portion 12b of the processing container 12 to inject the reaction gas supplied to the gas supply path 50a toward the bottom of the window member 40. In the exemplary embodiment, a plurality of injection ports 50b may be formed around the opening AP.

A gas source 50g of the reaction gas is connected to the gas supply path 50a via a valve 50v and a flow rate controller 50c such as, for example, a mass flow controller. Further, an exhaust port 22h is formed in the lower portion 12a of the processing container 12 below the outer edge of the placing table 14 as illustrated in FIG. 3. The exhaust port 22h is connected with the exhaust device 52 illustrated in FIG. 8.

The plasma generation section 22 may have one or more antennas 22a configured to introduce microwaves into the second region R2. Each of the antennas 22a may include a dielectric plate 40 and one or more waveguides 42. In the exemplary embodiment illustrated in FIGS. 1 to 3, four antennas 22a are arrayed in the circumferential direction with respect to the axis Z. Each antenna 22a has a window member 40 and a waveguide 42 provided above the second region R2. Meanwhile, the number of the antennas 22a may be arbitrary.

Figure 9:
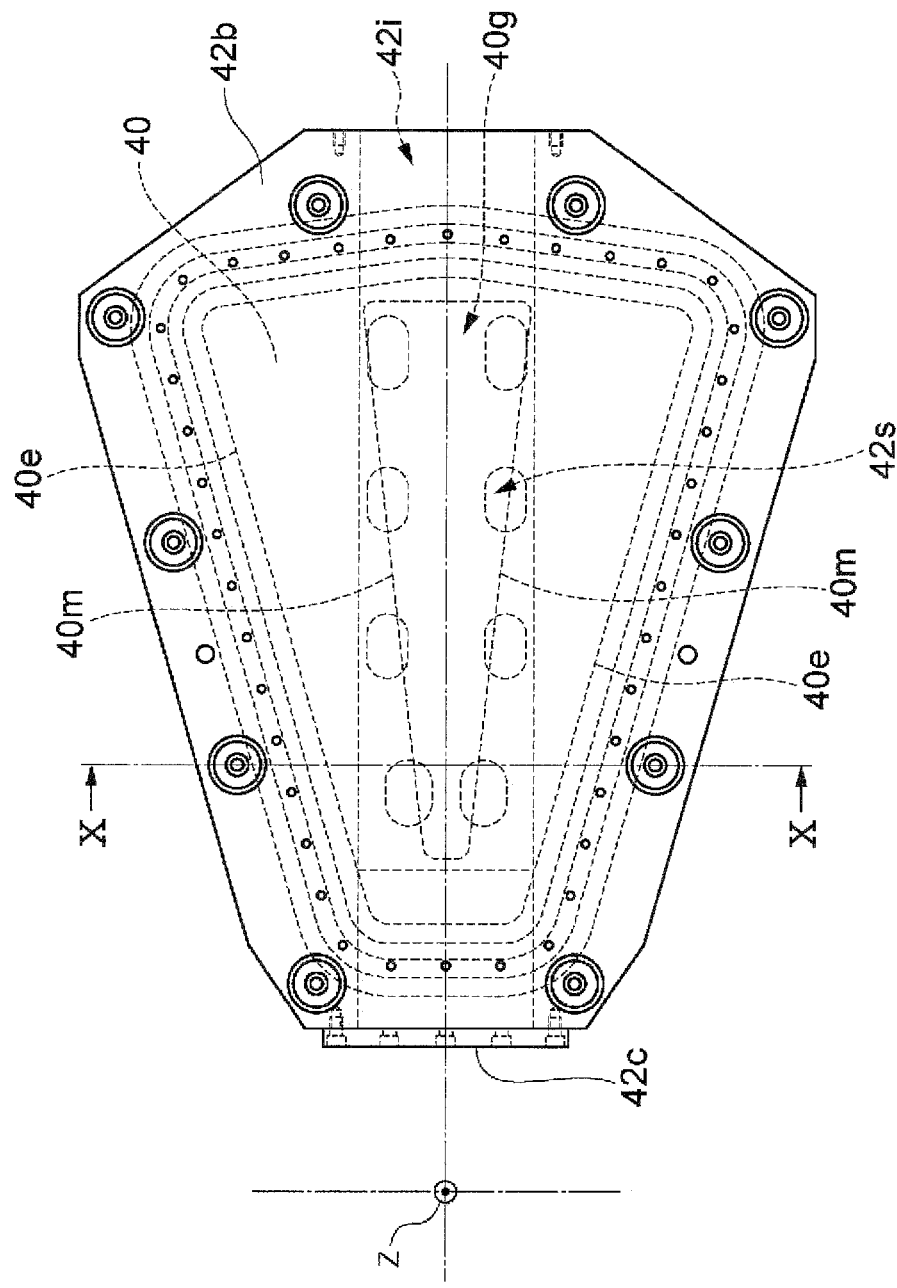
FIG. 9 is a plan view illustrating one antenna of the film-forming apparatus according to the exemplary embodiment, which is viewed from the top.
Figure 10:
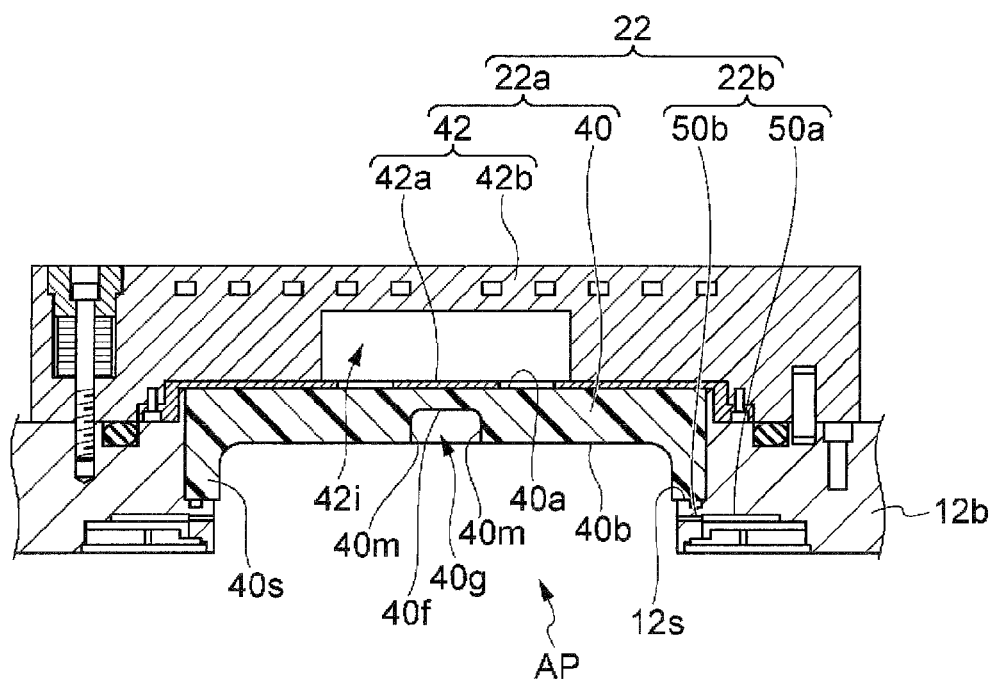
FIG. 10 is a cross-sectional view taken along line X-X of FIG. 9.

Here, reference will be further made to FIGS. 9 and 10. FIG. 9 is a plan view illustrating one antenna of the film-forming apparatus according to the exemplary embodiment, which is viewed from the top. FIG. 10 is a cross-sectional view taken along line X-X of FIG. 9. Meanwhile, in FIGS. 9 and 10, the plungers P1, P2, and P3 illustrated in FIG. 8 are omitted.

The waveguide 42 is provided on a top surface 40a of the window member 40. The waveguide 42 is a rectangular waveguide. The inner space of the waveguide 42 where the microwaves are propagated, that is, a waveguide path 42i extends in the radial direction with respect to the axis Z above the window member 40. In an exemplary embodiment, the waveguide 42 may include a slot plate (first wall) 42a, an upper member 42b, and a plunger P10.

The slot plate 42a is a plate-shaped member made of a metal material, and defines the waveguide path 42i from the lower side. The slot plate 42a comes in contact with the top surface 40a of the dielectric plate 40 to cover the top surface 40a of the dielectric plate 40. The slot plate 42a includes a plurality of slot holes 42s formed therein. The plurality of slot holes 42s is formed between the waveguide path 42i and the top surface 40a of the dielectric plate 40. The slot holes 42s have a hole shape in which a length in one direction is longer than a length (width) in the other direction. In an exemplary embodiment, the plurality of slot holes 42s is arrayed in the extension direction of the waveguide path 42i. In the exemplary embodiment, the slot holes 42s are arrayed in an arrangement of four slots×2 rows in the extension direction of the waveguide path 42i.

On the slot plate 42a, the upper member (second wall) 42b made of the metal is provided to cover the slot plate 42a. The upper member 42b is provided to define the waveguide path 42i between the slot plate 42a and the upper member 42b. That is, the slot plate 42a and the upper member 42b are provided to be in parallel with each other across the waveguide path 42i. The upper member 42b may be screw-fixed to the upper portion 12b so that the slot plate 42a and the window member 40 are sandwiched between the upper member 42b and the upper portion 12b of the processing container 12.

The plunger P10 is a metallic member, and attached to the slot plate 42a and an end of the upper member 42b. The plunger P10 includes a reflective surface Pr10. The reflective surface Pr10 constitutes a reflection end of the waveguide path 42i in the extension direction of the waveguide path 42i. The plunger P10 is configured to change the position of the reflective surface Pr10 in the extension direction of the waveguide path 42i. A peak position of the microwaves in the extension direction of the waveguide path 42i, that is, a position of an antinode of standing waves generated in the waveguide path 42i may be adjusted by the plunger P10.

A microwave generator 48 is connected to the other end of the waveguide path 42i. The microwave generator 48 generates, for example, microwaves of about 2.45 GHz and supplies the microwaves to the waveguide 42. The microwaves, which are generated by the microwave generator 48 and propagated in the waveguide 42, leaks out from the slot holes 42s of the slot plate 42a, and are supplied to the window member 40.

Figure 11:
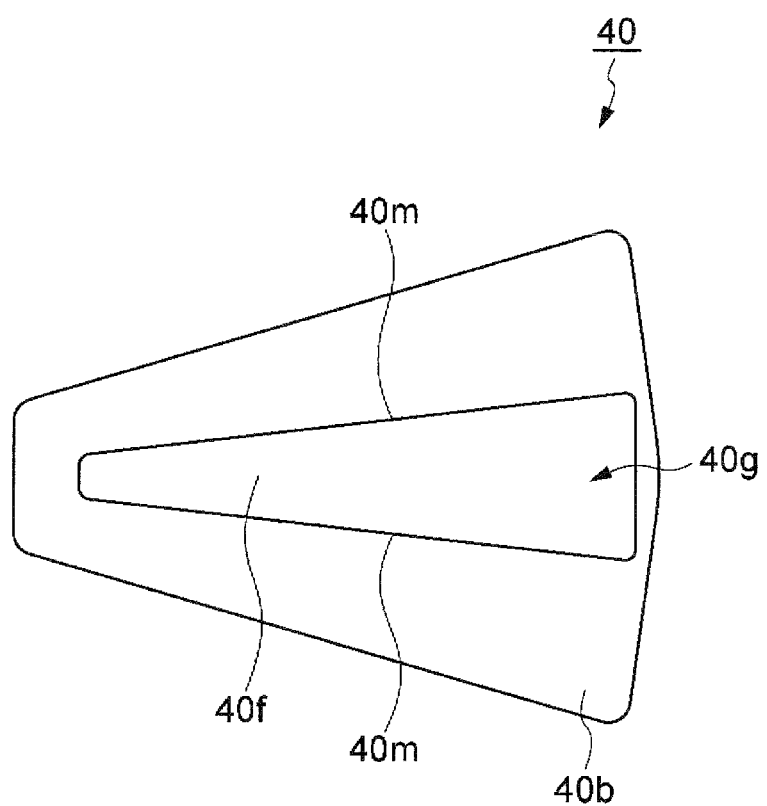
FIG. 11 is a plan view of a window member in a state where the window member is viewed from the bottom.

FIG. 11 is a plan view of the window member in a state where the window member is viewed from the bottom. Hereinafter, reference will be made to FIG. 11, in addition to FIGS. 8 to 10. The window member 40 is a member made of a dielectric material such as, for example, alumina ceramic. As illustrated in FIGS. 8 to 10, the window member 40 includes a top surface 40a and a bottom surface 40b. The window member 40 is provided such that the bottom surface 40b faces the second region R2, and supported by the upper portion 12b of the processing container 12.

The opening AP is formed in the upper portion 12b of the processing container 12 so as to expose the bottom surface 40b of the window member 40 to the second region R2. A planar size of the upper portion of the opening AP (a size in a plane crossing the axis Z) is larger than a planar size of the lower portion of the opening AP (a size in a plane crossing the axis Z). Accordingly, a step surface 12s facing upward is formed in the upper portion 12b defining the opening AP. Meanwhile, the peripheral portion of the window member 40 functions as a supported portion 40s and is in contact with the step surface 12s. The supported portion 40s is in contact with the step surface 12s to support the window member 40 on the upper portion 12b. Further, an elastic sealing member may be provided between the step surface 12s and the window member 40.

The window member 40 supported by the upper portion 12b faces the placing table 14 across the second region R2. A portion exposed from the opening AP of the upper portion 12b, that is, a portion facing the second region R2 of the bottom surface of the window member 40 functions as a dielectric window. Two edges 40e which come closer to each other as they approach the axis Z are included in the edges of the dielectric window.

The bottom surface 40b of the window member 40 defines a groove 40g below the waveguide path 42i. In an exemplary embodiment, the groove 40g extends in the radial direction with respect to the axis Z to be in parallel with the extension direction of the waveguide path 42i, below the waveguide path 42i. The groove 40g is a slot-shaped groove, which is a radially elongated groove. The thickness of the window member 40 in a portion defining the groove 40g is smaller than the thickness of the window member 40 around the groove 40g. That is, the distance between a bottom surface 40f of the groove 40g, that is, a surface defining the groove 40g from the top side and the top surface 40a of the window member 40 is smaller than the distance between the bottom surface 40b around the groove 40g and the top surface 40a. The microwaves are likely to pass through a thinner portion of the window member than other portions. Accordingly, the microwaves may be concentrated in the groove 40g by the window member 40. As a result, the plasma generation region may be fixed within the groove 40g even under a high pressure such as, for example, 5 Torr (666.6 Pa).

The area and shape of the groove 40g in a plane orthogonal to the axis Z may be determined such that the groove 40g has substantially the same area as that of the plasma generation region by obtaining a generation efficiency of the plasma when the bottom surface of the window member is flat, that is, the area of the plasma generation region just below the flat bottom surface of the window member. Accordingly, the plasma may be more securely confined to the groove 40g.

In the film-forming apparatus 10, the groove 40g extends in the radial direction with respect to the axis Z. Hence, the plasma generation region extends in the radial direction with respect to the axis Z. Therefore, according to the film-forming apparatus 10, unevenness of the plasma processing time depending on the position on the substrate may be reduced.

In an exemplary embodiment, the width of the groove 40g increases as being spaced away from the axis Z. Specifically, the window member 40 includes a pair of inner surfaces 40m defining the bottom surface 40f and the groove 40g from the circumferential direction. The groove 40g having the above-described shape is formed by setting the distance between the pair of inner surfaces 40m to be larger as being spaced away from the axis Z. In the exemplary embodiment, the plasma generation region is a region extending in the radial direction with respect to the axis Z, which has a larger width as being spaced away from the axis Z. Therefore, a difference in plasma processing time at different positions having different circumferential speeds on the substrate may be further reduced. Meanwhile, the angle formed between the pair of inner surfaces 40m may be a value such as, for example, 6° to 8°.

In an exemplary embodiment, the antenna 22a may further include a plurality of plungers. In the exemplary embodiment illustrated in FIG. 8, the antenna 22a includes three plungers P1, P2, P3. The plungers P1, P2, P3 are attached to the upper member 42b. The upper member 42b is formed with three openings arrayed in the radial direction with respect to the axis Z. The openings extend through the upper member 42b in the axis Z direction. Further, in an exemplary embodiment, the openings are formed above a portion between the slot holes 42s adjacent in the extension direction of the waveguide path 42i. Meanwhile, the arrangement places of the plungers P1, P2, P3 in the radial direction may be set arbitrary.

The plungers P1, P2, P3 include moving portions Pm1, Pm2, Pm3, respectively. Front end surfaces Pr1, Pr2, Pr3 of the respective moving portions Pm1, Pm2, Pm3 are substantially flat and function as reflective surfaces of the microwaves. The moving portions Pm1, Pm2, Pm3 are movable in a direction parallel to the axis Z. Accordingly, the positions of the front end surfaces Pr1, Pr2, Pr3 in the axis Z direction may be changed within a movable range including the three openings and a space above the three openings. According to the exemplary embodiment, a peak position of the microwaves may be adjusted in the waveguide path 42i by adjusting the position of the front end surfaces Pr1, Pr2, Pr3 of the plungers P1, P2, P3 in the axis Z direction. Further, the power of the microwaves leaking out from the plurality of slots may be adjusted. Accordingly, the electric strength distribution of the microwaves in the groove 40g may be adjusted in the radial direction with respect to the axis Z. As a result, a difference in the throughput by the plasma at different positions on the substrate W may be adjusted to be reduced.

Referring back to FIG. 1, the film-forming apparatus 10 may further include a control unit 60 that controls each element of the film-forming apparatus 10. The control unit 60 may be a computer including, for example, a central processing unit (CPU), a memory, and an input apparatus. The control unit 60 may control each element of the film-forming apparatus 10 by operating the CPU according to a program stored in the memory. In an exemplary embodiment, the control unit 60 may transmit a control signal to the driving device 24a so as to control the rotation speed of the placing table 14, transmit a control signal to a power supply connected to the heaters 26 so as to control a temperature of the substrates W, transmit a control signal to the valve 16v and the flow rate controller 16c so as to control the flow rate of the precursor gas, transmit a control signal to the exhaust device 34 so as to control an exhaust amount of the exhaust device 34 connected to the exhaust port 18a, transmit a control signal to the valve 20v and the flow rate controller 20c so as to control a flow rate of the purge gas, transmit a control signal to the microwave generator 48 so as to control power of microwaves, transmit a control signal to the valve 50v and the flow rate controller 50c so as to control a flow rate of the reaction gas, and transmit a control signal to the exhaust device 52 so as to control the exhaust amount of the exhaust device 52.

Hereinafter, a method of processing a substrate using the film-forming apparatus 10 described above will be described. In the following description, it is assumed that a silicon nitride film is generated on a Si substrate by the processing method.

(Substrate Transportation Process)

When a Si substrate W is processed by the film-forming apparatus 10, the Si substrate W is first transported on a substrate placing region 14a of the placing table 14 through the gate valve G, by a transporting apparatus such as, for example, a robot arm. In addition, the placing table 14 is rotated by the driving mechanism 24 and thus, the substrate placing region 14a in which the substrate W is placed is rotated and moved with the second region R2 as an origin.

(Nitrification Process 1)

Subsequently, the substrate W is nitrified. Specifically, a nitrogen-containing reaction gas is supplied to the second region R2 by the gas supply section 22b, and microwaves from the microwave generator 48 are supplied to the second region R2 through the antenna 22a. As a result, plasma of the reaction gas is generated in the second region R2. The surface of the substrate W is nitrified by the plasma of the reaction gas.

(Processing Process by Precursor Gas)

Subsequently, the substrate W is moved into the first region R1 with rotation of the placing table 14. In the first region R1, a precursor gas such as, for example, DCS is supplied by the gas supply section 16. As a result, Si contained in the precursor gas is chemically or physically adsorbed onto the substrate W.

(Purge Process)

Subsequently, the substrate W passes between the first region R1 and the second region R2 with rotation of the placing table 14. At this time, the substrate W is exposed to the purge gas supplied by the gas supply section 20. As a result, the Si-containing precursor gas excessively chemically adsorbed onto the substrate W is removed.

(Nitrification Process 2)

Subsequently, the substrate W is moved into the second region R2 with rotation of the placing table 14. A nitrogen-containing reaction gas is supplied to the second region R2 by the gas supply section 22b, and the microwaves from the microwave generator 48 are supplied to the second region R2 through the antenna 22a. Accordingly, plasma of the reaction gas is generated in the second region R2. The precursor gas chemically adsorbed onto the surface of the substrate W is nitrified by the plasma of the reaction gas.

With rotation of the placing table 14, the substrate W is repeatedly subjected to the processing process by the precursor gas, the purge process, and the nitrification process 2. As a result, a silicon nitride film is formed on the substrate W.

Hereinafter, results of Simulations 1 to 5 for the film-forming apparatus 10 will be described. In Simulations 1 to 5, an electric field distribution in the groove 40g was calculated by changing positions of the front end surfaces Pr1, Pr2, Pr3 of the plungers P1, P2, P3. Conditions of Simulations 1 to 5 were as follows. Meanwhile, the position of the front end surface of the plunger as described below is a position of the front end surfaces in the axis Z direction, and is set to '0 mm' when it is on the bottom surface of the upper member 42b, that is, a reference plane including a surface in contact with the waveguide path 42i. Further, the positions of the front end surfaces of the plungers moved upward from the reference plane are expressed as a distance in the axis Z direction from the reference plane.

<Common Conditions of Simulations 1 to 5>

Distance between the bottom surface 40f and the top surface 40a of the window member 40: 11 mm Distance between the bottom surface 40b and the top surface 40a around the groove 40g of the window member 40: 21 mm Length in the radial direction of the groove 40g: 312 mm Maximum width of the groove 40g: 49 mm Angle formed between a pair of inner surfaces 40m: 6°

Pitch in the radial direction between the plungers: 79 mm

Frequency of microwaves: 2.45 GHz

Power of microwaves generated by the microwave generator 48: 4 kW

<Individual Conditions of Simulations 1 to 5>

Figure 12:
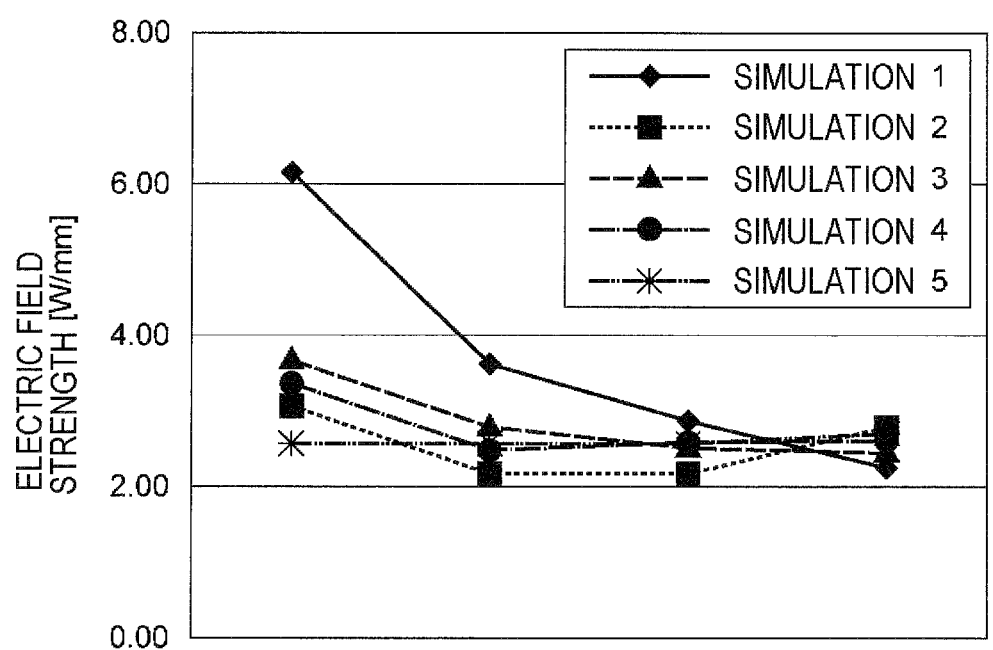
FIG. 12 is a graph illustrating results of Simulations 1 to 5.

Positions of front end surfaces Pr1, Pr2, Pr3 of Simulation 1: 0 mm, 0 mm, 0 mm Positions of front end surfaces Pr1, Pr2, Pr3 of Simulation 2: 20 mm, 20 mm, 20 mm Positions of front end surfaces Pr1, Pr2, Pr3 of Simulation 3: 25 mm, 15 mm, 15 mm Positions of front end surfaces Pr1, Pr2, Pr3 of Simulation 4: 25 mm, 20 mm, 15 mm Positions of front end surfaces Pr1, Pr2, Pr3 of Simulation 5: 30 mm, 20 mm, 15 mm FIG. 12 is a graph illustrating the results of Simulations 1 to 5. In the graph of FIG. 12, the horizontal axis represents a position in the radial direction in the groove 40g. Positions 1 to 4 represents positions below the slot hole 42s and closer to the axis Z in an order of Positions 1, 2, 3, and 4. Further, in the graph of FIG. 12, the vertical axis represents electric field strength. As illustrated in FIG. 12, according to Simulations 1 to 5, it has been found that the power of the microwaves in the radial direction in the groove 40g may be adjusted by adjusting the positions of the front end surfaces Pr1, Pr2, Pr3 of the respective plungers P1, P2, P3. Especially, as can be seen from the result of Simulation 5, it has been found that electric field strengths, which have substantially the same level, are obtained in the radial direction in the groove 40g by adjusting the positions of the front end surfaces Pr1, Pr2, Pr3 of the respective plungers P1, P2, P3.

Figure 13:
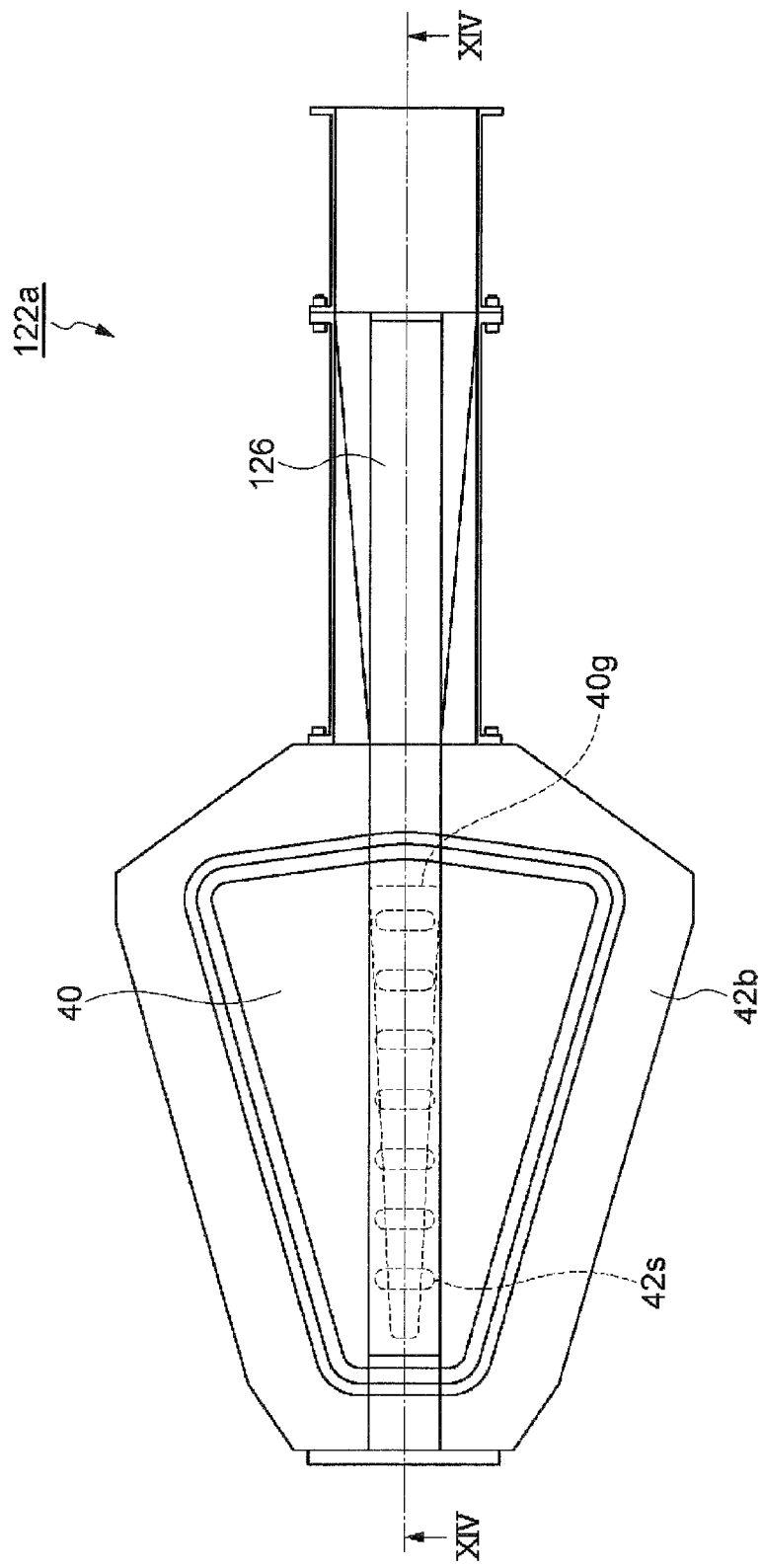
FIG. 13 is a plan view of an antenna according to another exemplary embodiment.
Figure 14:
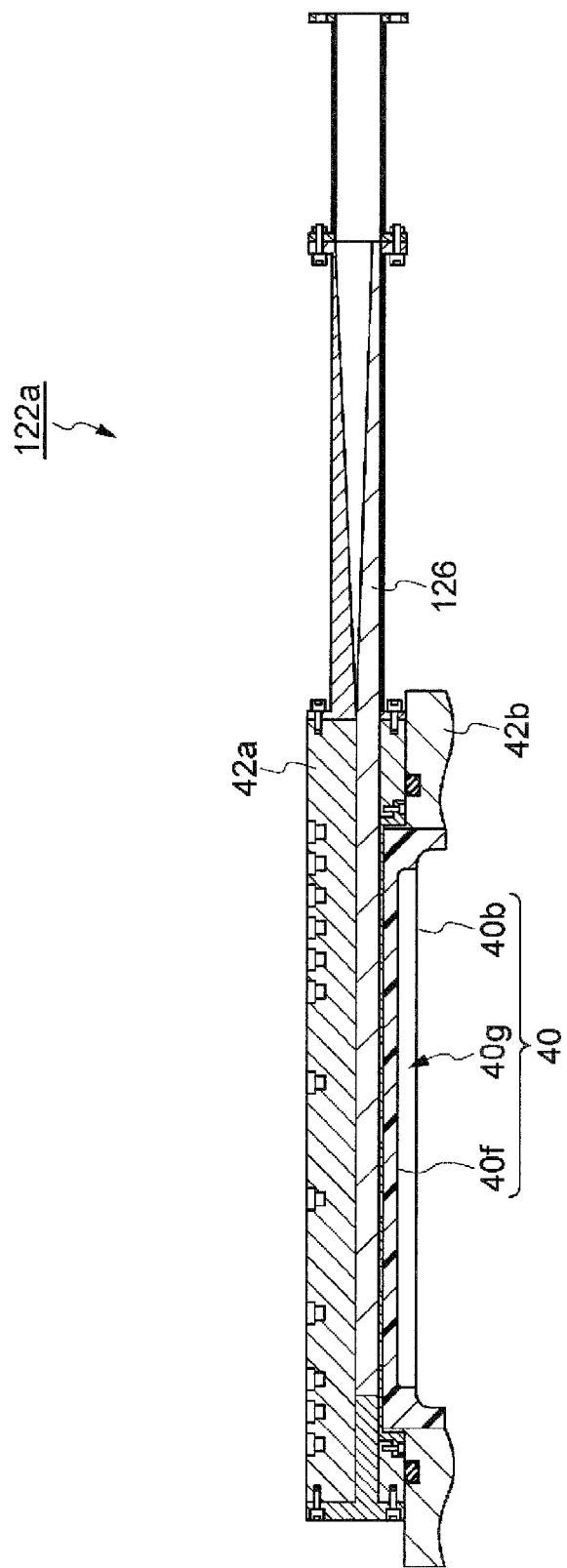
FIG. 14 is a cross-sectional view of the antenna according to another exemplary embodiment, taken along line XIV-XIV of FIG. 13.

Hereinafter, descriptions will be made on antennas according to several other exemplary embodiments, which are applicable to the film-forming apparatus 10 in place of the antenna 22a. Hereinafter, an antenna according to another exemplary embodiment will be described with respect to differences from the antenna 22a as described above. In the drawings as referenced below, portions that are the same as or correspond to those of the antenna 22a may be designated by the same reference numerals. FIG. 13 is a plan view of an antenna according to another exemplary embodiment, which is viewed from the top in a state where the upper member 42b is removed from the antenna. FIG. 14 is a cross-sectional view of the antenna according to another exemplary embodiment, taken along line XIV-XIV of FIG. 13.

An antenna 122a illustrated in FIGS. 13 and 14 may be employed in the film-forming apparatus 10 in place of the antenna 22a. In the antenna 122a, a slow wave plate 126 made of a dielectric such as, for example, quartz is provided in an inner space of a waveguide 42. In an upper portion of a window member 40, the slow wave plate 26 fills the inner space of the waveguide 42. Accordingly, the slow wave plate 26 becomes a waveguide path 42i. The wavelength of microwaves in the waveguide path constituted by the slow wave plate 26 becomes shorter than a wavelength of microwaves in a waveguide path constituted as a hollow inner space of the waveguide 42. Therefore, in the antenna 122a, a pitch between peaks of the microwaves in the extension direction of the waveguide path 42i, that is, an interval of antinodes of standing waves becomes narrower.

In correspondence with the pitch between the peaks of the microwaves in the waveguide path 42i of the antenna 122a, a slot plate 42a of the antenna 122a includes slot holes 42s arrayed in the radial direction with a pitch narrower than the pitch between the slot holes 42s of the antenna 22a. According to the antenna 122a having such a configuration, the electric field strength distribution in the groove 40g has a peak in the radial direction with a narrower pitch. Therefore, the plasma density distribution in the groove 40g may be more precisely controlled.

Figure 15:
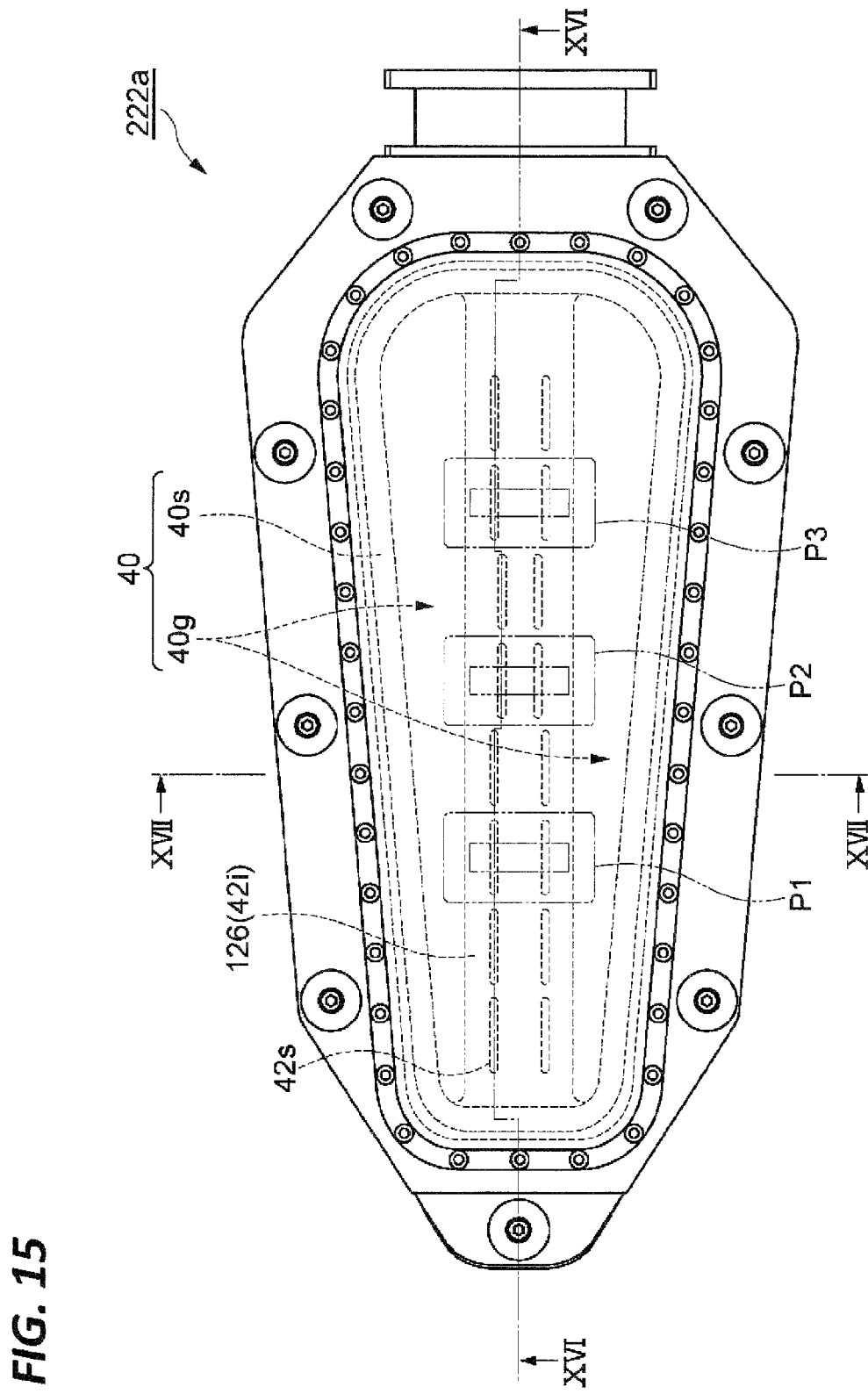
FIG. 15 is a plan view of an antenna according to still another exemplary embodiment, which is viewed from the top.
Figure 16:
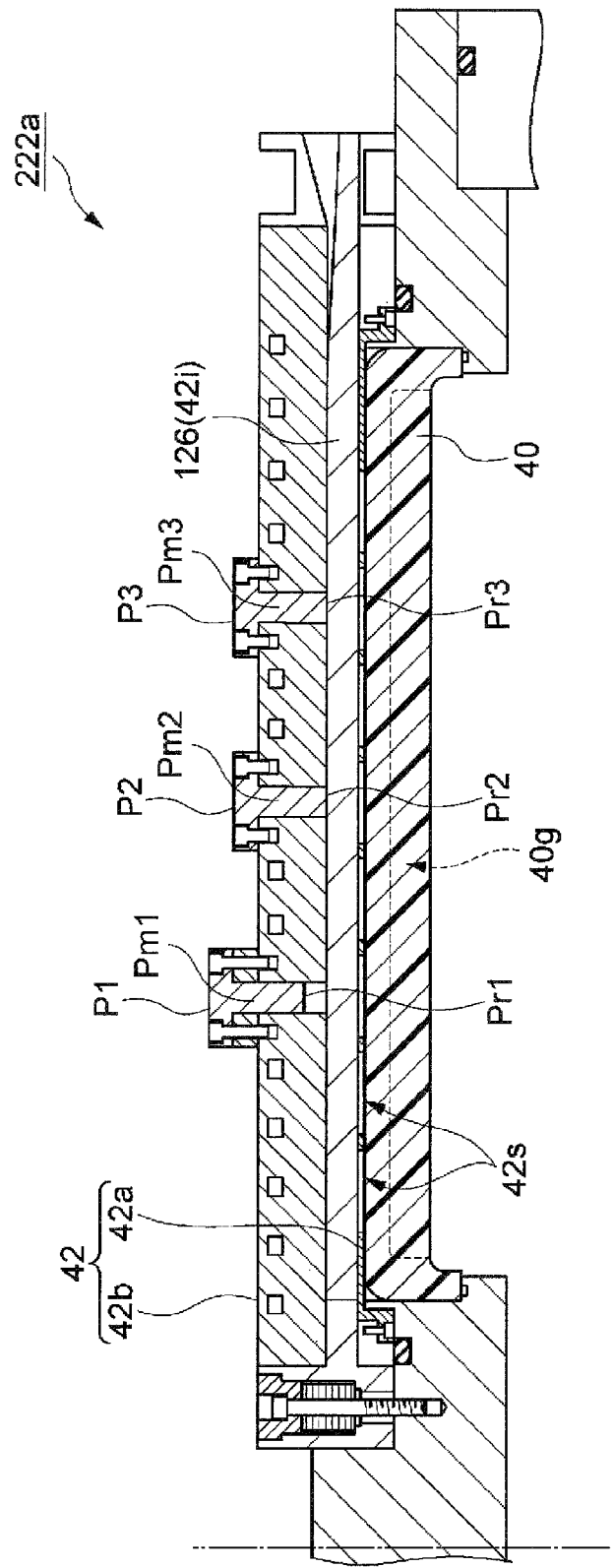
FIG. 16 is a cross-sectional view taken along line XVI-XVI of FIG. 15, which is viewed in the arrow direction.
Figure 17:
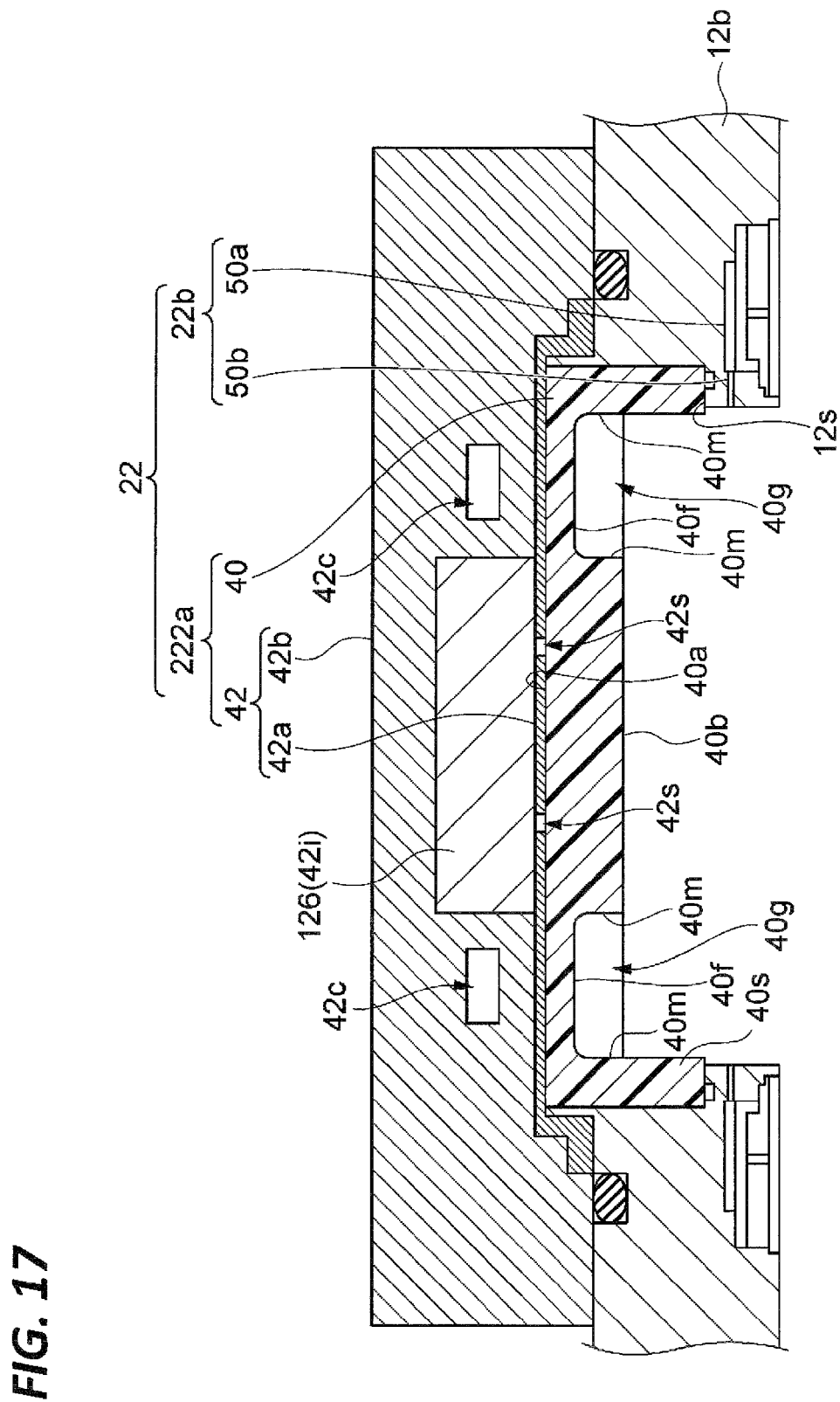
FIG. 17 is a cross-sectional view taken along line XVII-XVII of FIG. 15, which is viewed in the arrow direction.

FIG. 15 is a plan view of an antenna according to still another exemplary embodiment, which is viewed from the top. FIG. 16 is a cross-sectional view taken along line XVI-XVI of FIG. 15, which is viewed in the arrow direction. FIG. 17 is a cross-sectional view, which is viewed in the arrow direction of FIG. 15. In an antenna 222a illustrated in FIGS. 15 to 17, slot holes 42s are arrayed in an arrangement of eight slots×2 rows on a slot plate 42a of a waveguide 42 in the extension direction of a waveguide path 42i. Further, as illustrated in FIG. 17, in an upper member 42b of a waveguide 42, coolant paths 42c are formed along a waveguide path 42i in flank of the waveguide path 42i, that is, at both sides of the waveguide path 42i in a direction orthogonal to the extension direction of the waveguide path 42i. Coolant supplied from a chiller unit is circulated in the coolant paths 42c.

Further, in the antenna 222a, grooves 40g are formed below the coolant paths 42c, not below the waveguide path 42i. The space in the grooves 40g serves as a plasma generation region, and heat is generated in a window member 40 in the vicinity of the plasma generation region. According to the antenna 222a, since the coolant paths 42c are formed above the grooves 40g, heat of the window member 40 may be efficiently radiated.

Figure 18:
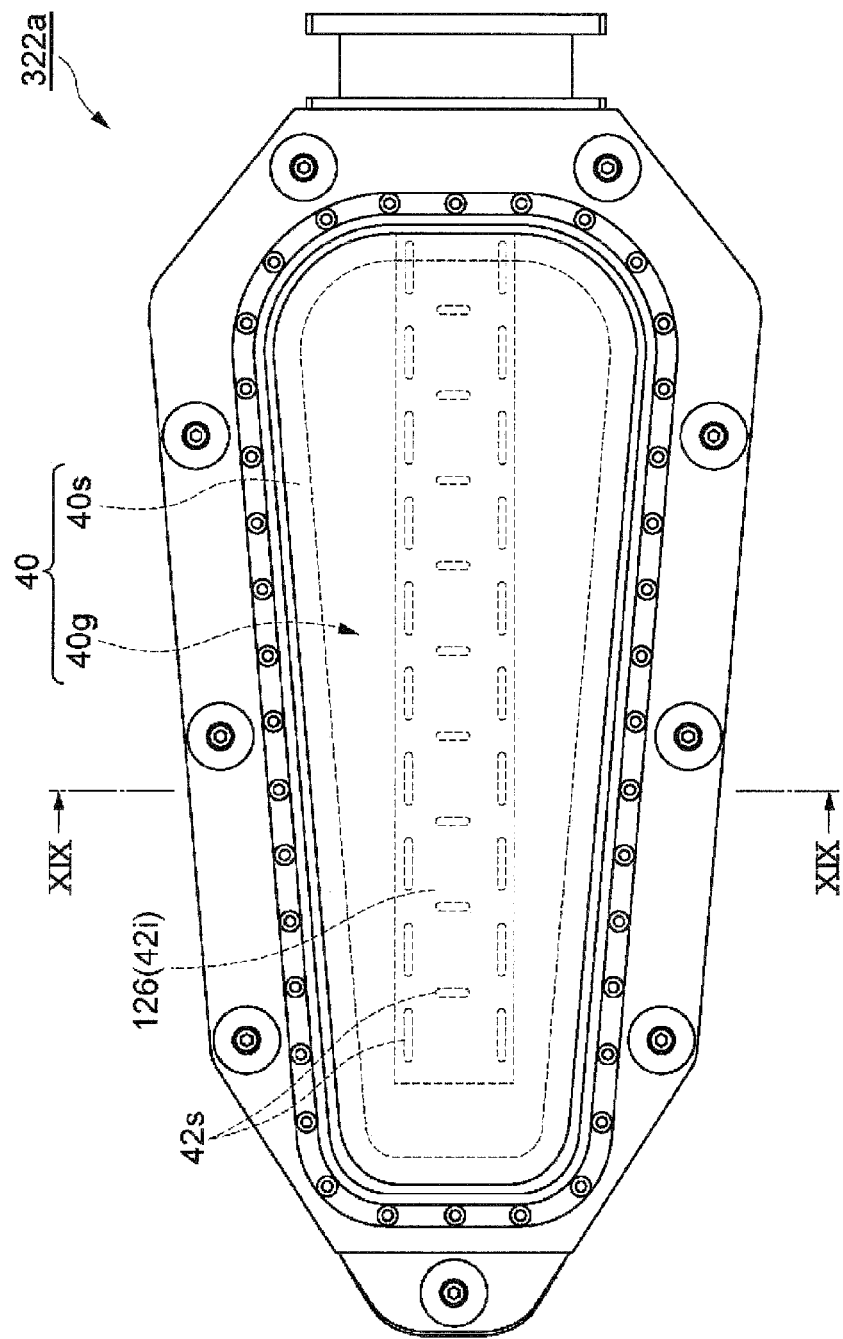
FIG. 18 is a plan view of an antenna according to yet another exemplary embodiment, which is viewed from the top.
Figure 19:
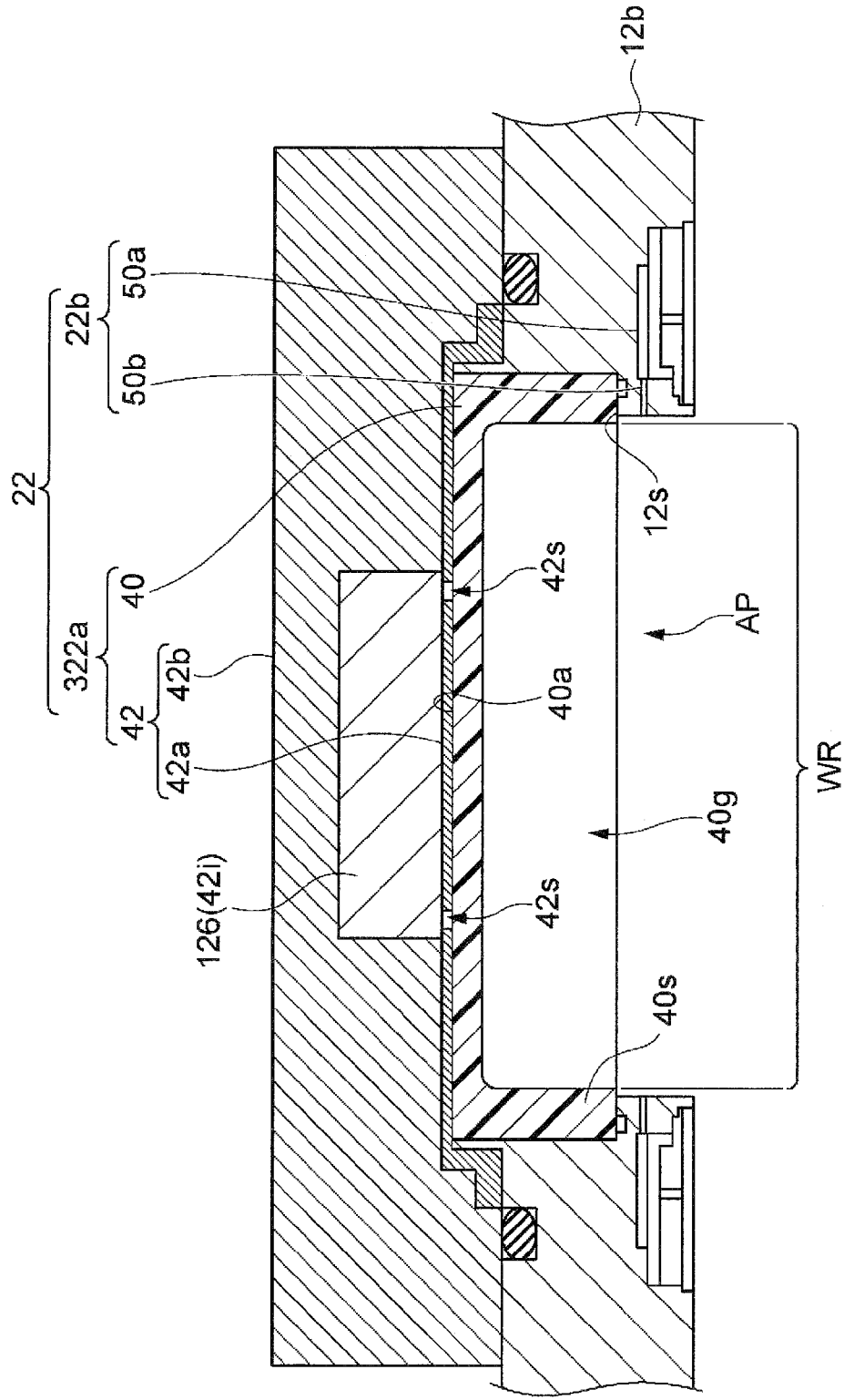
FIG. 19 is a cross-sectional view taken along line XIX-XIX of FIG. 18, which is viewed in the arrow direction.

FIG. 18 is a plan view of an antenna according to yet another exemplary embodiment, which is viewed from the top. FIG. 19 is a cross-sectional view taken along line XIX-XIX of FIG. 18, which is viewed in the arrow direction. In an antenna 322a illustrated in FIGS. 18 and 19, the window member 40 includes a window region WR surrounded by a peripheral portion, that is, a supported portion 40s. In the antenna 322a, the window region WR constitutes a bottom surface of a groove 40g. That is, in the antenna 322a, the groove 40g has substantially the same plane size as that of an opening AP. As a result, a wider plasma generation region may be obtained, as compared with the above-described exemplary embodiments.

Further, in the antenna 322a, a plurality of slot holes 42s is formed in a waveguide 42, that is, below a region where antinodes of standing waves of microwaves are generated in a waveguide path 42i. In other words, the slot holes 42s are disposed in a region surrounding regions below positions where antinodes of the standing waves are generated in the waveguide path 42i. Here, in the configuration in which the slot hole 42s is formed in a region below the antinodes of the standing waves, the electric field strength below the slot hole 42s may tend to be stronger than electric field strength in any other regions. That is, a region where electric field strength locally increases may be generated. However, according to the antenna 322a, since the slot region 42s is formed in a region below the antinode of the standing waves, the unevenness of the electric field strength distribution may be further reduced.

Figure 20:
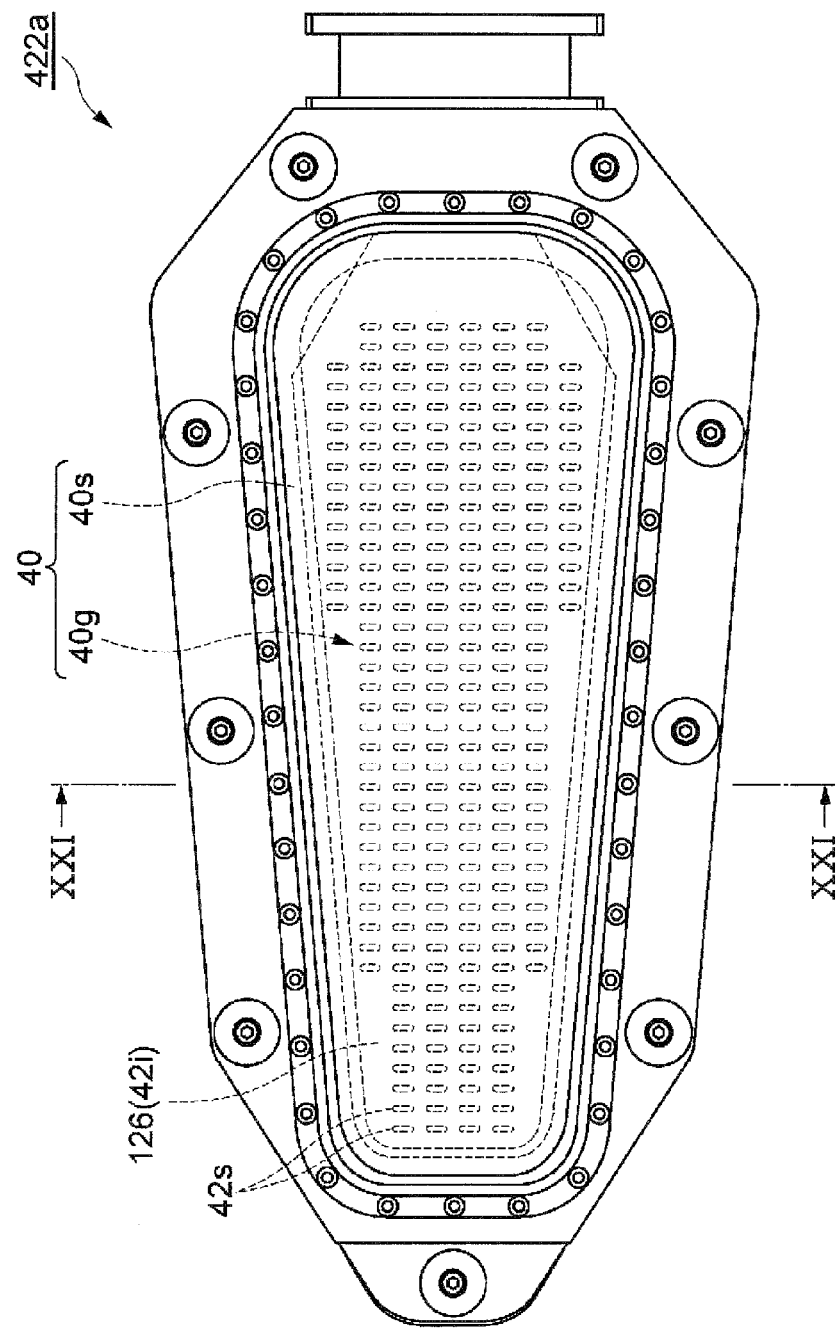
FIG. 20 is a plan view of an antenna according to still yet another exemplary embodiment, which is viewed from the top.
Figure 21:
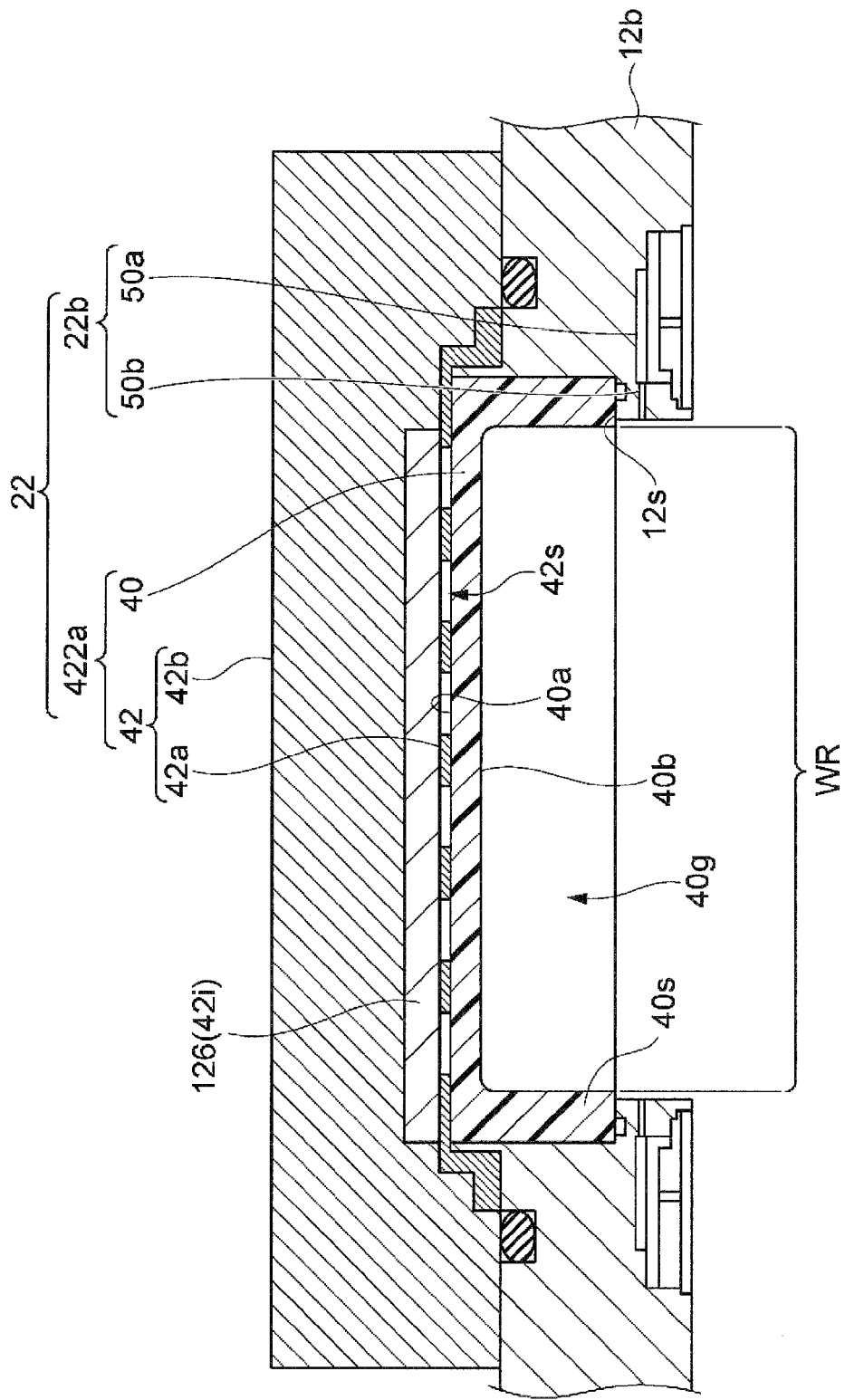
FIG. 21 is a cross-sectional view taken along line XXI-XXI of FIG. 20, which is viewed in the arrow direction.

FIG. 20 is a plan view of an antenna according to still yet another exemplary embodiment, which is viewed from the top. FIG. 21 is a cross-sectional view taken along line XXI-XXI of FIG. 20, which is viewed in the arrow direction. A window member 40 of an antenna 422a illustrated in FIGS. 20 and 21 is the same as the window member of the antenna 322a, and includes a peripheral portion, that is, a window region WR continued to a supported portion 40s, and substantially the whole of the window region constitutes a bottom surface of a groove 40g. Further, in the antenna 422a, a waveguide 42 defines a waveguide path 42i so as to extend above the substantially whole surface of the window region WR. The waveguide path 42i is constituted by a slow wave plate 126 provided inside the waveguide 42. Further, in the antenna 422a, the slow wave plate 126 may be made of the same material as that of the window member 40. For example, when the window member 40 is made of alumina ceramic, the slow wave plate 126 may also be made of alumina ceramic. Further, a slot plate 42a includes a plurality of slot holes 42a formed to be distributed below the whole surface of the slow wave plate 126.

In the antenna 422a, since the slow wave plate 126 made of the same material as that of the window member 40 is provided so as to extend above the substantially whole region of the groove 40g, heat generated in the window member 40 is more efficiently radiated through the slow wave plate 126. In addition, since the plurality of slot holes 42s is distributed below the whole surface of the slow wave plate 126, the unevenness of the electric field strength in the groove 40g may be further reduced.

Hereinafter, results of Simulations 6 to 14 for the antenna 222a will be described. In Simulations 6 to 14, an electric field distribution in the groove 40g was calculated by changing positions of front end surfaces Pr1, Pr2, Pr3 of plungers P1, P2, P3 of antenna 222a. Conditions of Simulations 6 to 14 were as follows. Meanwhile, the position of the front end surface of a plunger as described below is a position of the front end surface in the axis Z direction, and is set to '0 mm' when it is on the bottom surface of the upper member 42b, that is, a reference plane including a surface in contact with the waveguide path 42i. Further, the position of the front end surface of the plunger after being moved upward from the reference plane is expressed as a distance in the axis Z direction from the reference plane.

Figure 22:
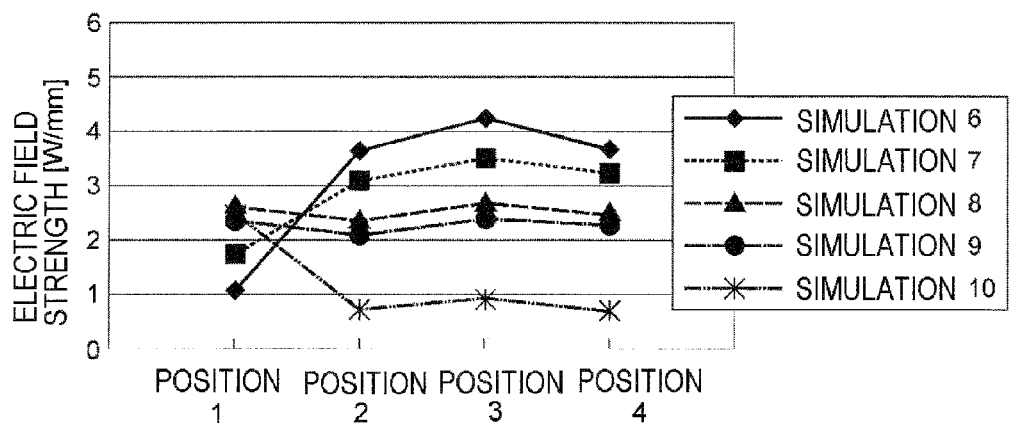
FIG. 22 is a graph illustrating results of Simulations 6 to 10.
Figure 23:
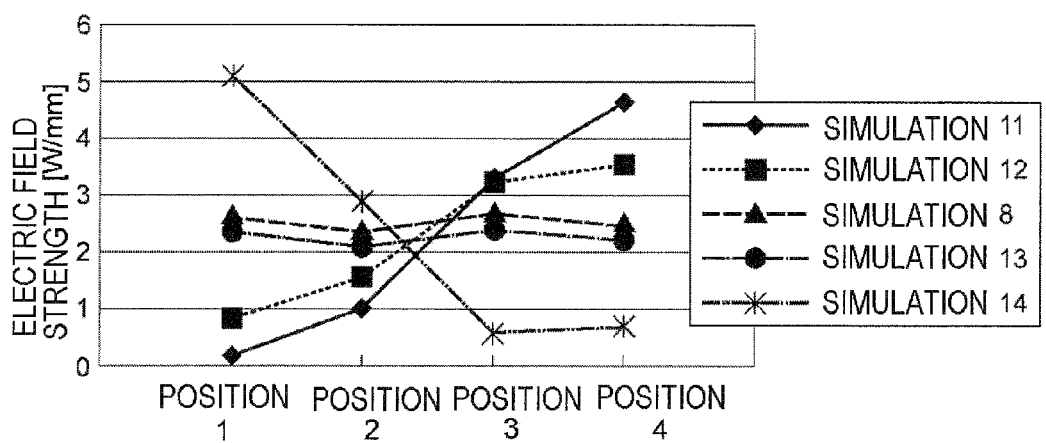
FIG. 23 is a graph illustrating results of Simulations 8 and 11 to 14.

<Common Conditions of Simulations 6 to 14>
Distance between the bottom surface 40f and the top surface 40a of the window member 40: 11 mm
Distance between the bottom surface 40b and the top surface 40a around the groove 40g of the window member 40: 21 mm
Length in the radial direction of the groove 40g: 312 mm
Maximum width of the groove 40g: 49 mm
Angle formed between a pair of inner surfaces 40m: 6°
Pitch in the radial direction between the plungers: 79 mm
Frequency of microwaves: 2.45 GHz
Power of microwaves generated by the microwave generator 48: 4 kW
<Individual Conditions of Simulations 6 to 14>
Positions of front end surfaces Pr1, Pr2, Pr3 of Simulation 6: 20 mm, 0 mm, 0 mm
Positions of front end surfaces Pr1, Pr2, Pr3 of Simulation 7: 10 mm, 0 mm, 0 mm
Positions of front end surfaces Pr1, Pr2, Pr3 of Simulation 8: 0 mm, 0 mm, 0 mm
Positions of front end surfaces Pr1, Pr2, Pr3 of Simulation 9: 40 mm, 0 mm, 0 mm
Positions of front end surfaces Pr1, Pr2, Pr3 of Simulation 10: 30 mm, 0 mm, 0 mm
Positions of front end surfaces Pr1, Pr2, Pr3 of Simulation 11: 0 mm, 20 mm, 0 mm
Positions of front end surfaces Pr1, Pr2, Pr3 of Simulation 12: 0 mm, 10 mm, 0 mm
Positions of front end surfaces Pr1, Pr2, Pr3 of Simulation 13: 0 mm, 40 mm, 0 mm
Positions of front end surfaces Pr1, Pr2, Pr3 of Simulation 14: 0 mm, 30 mm, 0 mm FIG. 22 is a graph illustrating results of Simulations 6 to 10, and FIG. 23 is a graph illustrating results of Simulations 8 and 11 to 14. In the graphs of FIGS. 22 and 23, the horizontal axis represents a position in the radial direction in the groove 40g. Positions 1 to 4 are positions on a line passing through the center of the circumferential direction of the groove 40g in the radial direction, and are positions of −112.5 mm, −37.5 mm, 37.5 mm, 112.5 mm, respectively from the center of the groove 40g on the line in the radial direction. Meanwhile, a position having a negative length in the radial direction refers to a position closer to the axis Z than the center of the groove 40g on the line. Further, in the graphs of FIGS. 22 and 23, the vertical axis represents electric field strength. As illustrated in FIGS. 22 and 23, according to Simulations 6 to 14, it has been found that the power of the microwaves in the radial direction in the groove 40g may be adjusted by adjusting the positions of the front end surfaces Pr1, Pr2, Pr3 of the respective plungers P1, P2, P3. Specifically, it has been found that substantially uniform electric filed strength may be formed in the radial direction. Further, it has been found that electric field distribution increasing as being spaced away from the axis Z in the radial direction or electric field distribution decreasing as being spaced away from the axis Z in the radial direction may be formed.

Therefore, in an example, it has been found that a plurality of antennas 222a may be arrayed in the circumferential direction and the positions of the front end surfaces Pr1, Pr2, Pr3 of the plungers P1, P2, P3 may be set such that the electric field strength distribution formed by all the antennas 222a becomes a substantially uniform electric field strength distribution in the radial direction.

In another example, it has been found that a plurality of antennas 222a may be arrayed in the circumferential direction and the positions of the front end surfaces Pr1, Pr2, Pr3 of the plungers P1, P2, P3 may be set such that the electric field strength distribution formed by a part of the antennas 222a becomes an electric field strength distribution in the radial direction decreasing as being spaced away from the axis Z in the radial direction and the electric field strength distribution formed by the rest of the antennas 222a becomes an electric field distribution increasing as being spaced away from the axis Z in the radial direction. In this case, a quantity in which a substrate W is processed by the plasma formed by a single antenna may vary depending on the position of the wafer W, but the wafer W may be subjected to a plasma processing uniformly at every position thereof by circling the wafer W around the axis Z to expose the wafer W to the plasma formed by the plurality of antennas.

Although various exemplary embodiments have been described, the present disclosure is not limited to the exemplary embodiments described above, but various modifications may be made thereto. For example, the plurality of slot holes may all have the same shape, or the plurality of slots may be different from each other in width and/or length. Further, the dielectric window, the material of the slow wave plate, and the frequency of the microwaves are not limited to the exemplary embodiments described above, but various modifications may be made thereto.

DESCRIPTION OF REFERENCE NUMERALS

10: Film-forming apparatus
12: Processing container

C: Processing chamber
R1: Region
R2: Region
14: Placing table
14a: Substrate placing region
16: First gas supply section (precursor gas supply section)
16a: Injection section
18: Exhaust section
18a: Exhaust port
20: Gas supply section
20a: Injection port
22: Plasma generation section
22a: Antenna
22b: Second gas supply section (reaction gas supply section)
40: Window member
40a: Top surface
40b: Bottom surface
40g: Groove
40f: Bottom surface
40m: Inner surface
42: Waveguide
42a: Slot plate (first wall)
42b: Upper member (second wall)
42s: Slot hole
48: Microwave generator
P1, P2, P3: Plunger
Pr1, P2r, Pr3: Front end surface (reflective surface)

What is claimed is:

1. A film-forming apparatus comprising:
a placing table including a substrate placing region and is rotatable around an axis such that the substrate placing region moves in a circumferential direction;
a processing container which defines a processing chamber including a first region and a second region that are arrayed circumferentially, the processing chamber accommodating the placing table, and the substrate placing region passing through the first region and the second region sequentially in this order, while moving in the circumferential direction with respect to the axis by rotation of the placing table;
a first gas supply section configured to supply a precursor gas to the first region; and
a plasma generation section configured to generate plasma of a reaction gas in the second region, the plasma generation section including:
i) a second gas supply section configured to supply the reaction gas to the second region; and
(ii) an antenna configured to introduce microwaves into the second region, the antenna including:
(a) a dielectric window member including a top surface and a bottom surface and provided above the second region; and
(b) a waveguide provided on the top surface of the window member, the waveguide being a rectangular waveguide, wherein the waveguide defines a waveguide path that extends in a radial direction with respect to the axis, wherein the waveguide includes a plurality of slot holes that allows the microwaves to pass therethrough from the waveguide path toward the window member, and wherein the bottom surface of the window member defines a groove that is slot-shaped and extends in the radial direction along the waveguide path, with respect to the axis.

2. The film-forming apparatus of claim 1, wherein the window member includes a pair of inner surfaces defining the groove from the circumferential direction, and
a distance between the pair of inner surfaces increases as being spaced away from the axis.

3. The film-forming apparatus of claim 1, wherein the waveguide includes a first wall in contact with the top surface of the window member and a second wall provided to be in parallel with the first wall,
the plurality of slot holes is formed in the first wall and arrayed in an extension direction of the waveguide path,
the second wall includes a plurality of openings formed therein, and the plurality of openings is arrayed in the extension direction of the waveguide path,
the apparatus further comprises a plurality of plungers attached to the second wall, and
each of the plurality of plungers includes a reflective surface capable of changing a position in a direction parallel to the axis in and above a corresponding opening among the plurality of openings.

4. The film-forming apparatus of claim 1, wherein the groove extends below the waveguide path.

5. The film-forming apparatus of claim 1, wherein a coolant path is formed at a side of the waveguide path to extend along the waveguide path, and
the groove is formed below the coolant path.

6. The film-forming apparatus of claim 1, wherein the window member includes a peripheral portion and a window region surrounded by the peripheral portion, and the whole of the window region constitutes a bottom surface of the groove.

7. The film-forming apparatus of claim 6, wherein the waveguide defines the waveguide path such that the waveguide path extends above substantially the whole surface of the window region,
the apparatus further comprises a dielectric slow wave plate provided inside the waveguide, the slow wave plate constituting the waveguide path above the window region, and
the plurality of slot holes is formed to be distributed below the whole surface of the slow wave plate.

8. The film-forming apparatus of claim 1, wherein the plurality of slot holes is formed below a region where a node of standing waves of the microwaves is generated in the waveguide.

9. The film-forming apparatus of claim 1, further comprising:
a dielectric slow wave plate provided inside the waveguide.

10. The film-forming apparatus of claim 1, wherein the waveguide comprises a plunger.

11. The film-forming apparatus of claim 10, wherein the plunger is made of metal.

12. The film-forming apparatus of claim 1, wherein each of the plurality of slot holes has a hole shape in which a length along the waveguide is longer than a length in a perpendicular direction.

13. The film-forming apparatus of claim 12, wherein the plurality of slot holes are arrayed in two rows along the waveguide.

* * * * *